US012622143B2

(12) United States Patent
Yang et al.

(10) Patent No.: US 12,622,143 B2
(45) Date of Patent: May 5, 2026

(54) DISPLAY SUBSTRATE AND DISPLAY APPARATUS

(71) Applicants: Chengdu BOE Optoelectronics Technology Co., Ltd., Chengdu (CN); BOE TECHNOLOGY GROUP CO., LTD., Beijing (CN)

(72) Inventors: Huijuan Yang, Beijing (CN); Tingliang Liu, Beijing (CN); Yi Zhang, Beijing (CN); Xiaoqing Shu, Beijing (CN); Maoying Liao, Beijing (CN); Yu Wang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 504 days.

(21) Appl. No.: 18/028,137

(22) PCT Filed: Mar. 31, 2022

(86) PCT No.: PCT/CN2022/084444

§ 371 (c)(1),
(2) Date: Mar. 23, 2023

(87) PCT Pub. No.: WO2023/184352

PCT Pub. Date: Oct. 5, 2023

(65) Prior Publication Data

US 2024/0306446 A1      Sep. 12, 2024

(51) Int. Cl.
*H10K 59/131*      (2023.01)
*H10K 59/88*      (2023.01)

(52) U.S. Cl.
CPC ........... *H10K 59/131* (2023.02); *H10K 59/88* (2023.02)

(58) Field of Classification Search
CPC ........... H10K 59/1213; H10K 59/1216; H10K 59/12; H10K 59/131; G09G 3/3233
See application file for complete search history.

(56) References Cited

U.S. PATENT DOCUMENTS

2008/0067932 A1      3/2008   Baek et al.
2021/0399078 A1*   12/2021   Um ........................ H10D 86/60
(Continued)

FOREIGN PATENT DOCUMENTS

CN         111244070 A      6/2020
CN         111435677 A      7/2020
(Continued)

*Primary Examiner* — Yuzhen Shen
(74) *Attorney, Agent, or Firm* — HOUTTEMAN LAW LLC

(57) ABSTRACT

A display substrate has a display region and a dummy pixel region including at least one pixel missing region and a redundant region; the display substrate includes a base substrate and a driving circuit layer including a plurality of circuit units, at least one of which includes a pixel driving circuit and initial signal lines; the pixel driving circuit includes first and second pixel driving circuits in the display region and the redundant region, respectively, and a capacitance value of a storage capacitor in the first pixel driving circuit is less than that in the second pixel driving circuit; the initial signal lines include first and second initial signal lines extending along first and second directions, respectively; the first initial signal line is electrically connected to at least a part of the second initial signal lines crossing the first initial signal line.

17 Claims, 16 Drawing Sheets

(56) References Cited

U.S. PATENT DOCUMENTS

| | | | | | |
|---|---|---|---|---|---|
| 2022/0059637 A1 * | 2/2022 | Choi | ................... | G09G 3/3233 | |
| 2023/0247876 A1 * | 8/2023 | Kim | ................... | G09G 3/3233 | |
| | | | | | 257/40 |

FOREIGN PATENT DOCUMENTS

| | | | | | |
|---|---|---|---|---|---|
| CN | 111489646 A | | 8/2020 | | |
| CN | 111489682 A | * | 8/2020 | .............. | G09G 3/30 |
| CN | 112071268 A | | 12/2020 | | |
| CN | 112785958 A | | 5/2021 | | |
| CN | 113540200 A | | 10/2021 | | |
| CN | 113674693 A | | 11/2021 | | |
| EP | 3872799 A1 | | 9/2021 | | |
| JP | 2009198942 A | | 9/2009 | | |

* cited by examiner

DISPLAY SUBSTRATE AND DISPLAY APPARATUS

TECHNICAL FIELD

The present disclosure belongs to the field of display technology, and particularly relates to a display substrate and a display apparatus.

BACKGROUND

Organic Light Emitting Diode (OLED) and Quantum-dot Light Emitting Diode (QLED) are active light emitting display devices, and have the advantages of self-luminescence, wide viewing angle, high contrast, low power consumption, ultra high response speed, light weight and thinness, flexibility, low cost, and the like. With the continuous development of the display technology, a flexible display apparatus using an OLED or a QLED as a light emitting device and using a Thin Film Transistor (TFT) for signal control has become a mainstream product in the display field.

SUMMARY

The present disclosure aims to solve at least one technical problem in the prior art and provides a display substrate and a display apparatus.

In a first aspect, an embodiment of the present disclosure provides a display substrate having a display region and a dummy pixel region surrounding the display region, where the dummy pixel region includes at least one pixel missing region and a redundant region adjacent to the pixel missing region; and the display substrate includes:

a base substrate;

a driving circuit layer on the base substrate, where the driving circuit layer includes a plurality of circuit units; at least one of the plurality of circuit units includes a plurality of pixel driving circuits and a plurality of initial signal lines; the plurality of pixel driving circuits include a first pixel driving circuit in the display region and a second pixel driving circuit in the redundant region, and a capacitance value of a storage capacitor in the first pixel driving circuit is less than a capacitance value of a storage capacitor in the second pixel driving circuit; and a light emitting structure layer on side of the driving circuit layer away from the base substrate, where the light emitting structure layer includes a plurality of light emitting devices in the display region, where the plurality of initial signal lines include a plurality of first initial signal lines each extending along a first direction and a plurality of second initial signal lines each extending along a second direction; the first direction and the second direction cross each other, and each of the plurality of first initial signal lines is electrically connected to at least a part of the plurality of second initial signal lines crossing the first initial signal line.

The first pixel driving circuit and the second pixel driving circuit each include a first transistor, a second transistor, a third transistor, a fourth transistor, a seventh transistor, and the storage capacitor; and the first pixel driving circuit further includes a fifth transistor and a sixth transistor.

The driving circuit layer includes a semiconductor layer, a first conductive layer, a second conductive layer, a third conductive layer, and a fourth conductive layer in this order away from the base substrate; the semiconductor layer includes active layers of a plurality of transistors in the pixel driving circuit; the first conductive layer includes a scanning signal line, gate electrodes of the plurality of transistors and a first plate of the storage capacitor; the second conductive layer includes the first initial signal line and a second plate of the storage capacitor; and the fourth conductive layer includes the second initial signal line.

The second initial signal line includes an extension part and a connection part connected to each other; the extension part extends in the second direction, and the connection part is connected to the first initial signal line.

In the circuit unit having the first pixel driving circuit, an overlapping region between orthographic projections of the second plate of the storage capacitor and the extension part on the base substrate is a first region; in the circuit unit having the second pixel driving circuit, an overlapping region between orthographic projections of the second plate of the storage capacitor and the extension part on the base substrate is a second region; and an area of the first region is less than an area of the second region.

The display substrate includes i number of rows and j number of columns of circuit units; $i \geq 2$; $j \geq 3$; and both of i and j are integers;

where a shape of the second initial signal line in the circuit unit in an $M^{th}$ row and an $N^{th}$ column and a shape of the second initial signal line in the circuit unit in an $(M+1)^{th}$ row and an $(N+2)^{th}$ column are substantially the same as each other; a shape of the second initial signal line in the circuit unit in the $(M+1)^{th}$ row and the $N^{th}$ column and a shape of the second initial signal line in the circuit unit in the $M^{th}$ row and the $(N+2)^{th}$ column are substantially the same as each other, where $1 \leq M \leq i$; $1 \leq N \leq j$; and both of M and N are integers.

In the circuit unit in the $M^{th}$ row and the $N^{th}$ column and the circuit unit in the $(M+1)^{th}$ row and the $(N+2)^{th}$ column, the extension part includes a first initial section, a second initial section and a third initial section sequentially connected together along the second direction, the first initial section and the third initial section each extend along the second direction, and a first included angle $\theta 1$ exists between an extending direction of the second initial section and the second direction, $0° \leq \theta 1 \leq 90°$.

In the circuit unit in the $M^{th}$ row and the $(N+2)^{th}$ column and the circuit unit in the $M^{th}$ row and the $N^{th}$ column, the extension part includes a fourth initial section, a fifth initial section, a sixth initial section, a seventh initial section and an eighth initial section sequentially connected along the second direction, the fourth initial section, the sixth initial section and the eighth initial section each extend along the second direction, a second included angle $\theta 2$ exists between an extending direction of the fifth initial section and the second direction, a third included angle $\theta 3$ exists between an extending direction of the seventh initial section and the second direction, $0° \leq \theta 2 \leq 90°$, and $0° \leq \theta 3 \leq 90°$.

The plurality of circuit units further include a plurality of first power supply lines, an orthographic projection of the extension part on the base substrate at least partially overlaps an orthographic projection of a corresponding one of the plurality of first power supply lines on the base substrate; and an orthographic projection of the connection part on the base substrate at least partially overlaps an orthographic projection of the first initial signal line on the base substrate.

The first power supply line is a polygonal line of unequal width; the first power supply line includes a first power supply section, a second power supply section, a third power supply section, a fourth power supply section and a fifth power supply section sequentially connected along the second direction; the first power supply section, the third power supply section, and the fifth power supply section each extend along the second direction, and an extending direction of the second power supply section and an extending direction of the fourth power supply section are different from each other and each cross the second direction.

The first power supply line is in the third conductive layer.

The second conductive layer further includes a shielding electrode electrically connected to the first power supply line through a via.

An orthographic projection of at least a part of the shielding electrode on the base substrate is between orthographic projections of a second electrode of the first transistor in the pixel driving circuit on the base substrate.

The plurality of circuit units further include a plurality of data signal lines in the fourth conductive layer.

The plurality of circuit units further include a plurality of second connection electrodes; the connection part is connected to a corresponding one of the plurality of second connection electrodes through a via; the second connection electrode is connected to the first initial signal line through a via; the second connection electrode is further connected to a first region of a first transistor and a second region of a seventh transistor in the pixel driving circuit through vias.

The plurality of second connection electrodes are in the third conductive layer.

An overlapping area between a first plate and a second plate of the storage capacitor in the first pixel driving circuit is less than an overlapping area between a first plate and a second plate of the storage capacitor in the second pixel driving circuit.

The plurality of circuit units form a plurality of unit rows arranged side by side along the second direction and a plurality of unit columns arranged side by side along the first direction, the pixel driving circuits in each of the plurality of unit rows are arranged side by side along the first direction; the pixel driving circuits in each of the plurality of unit columns are arranged side by side along the second direction; and the second initial signal lines in all the circuit units in each of at least one of the plurality of unit columns are connected to each other.

The plurality of unit columns include a plurality of first unit columns and a plurality of second unit columns alternately arranged; and each of the plurality of second initial signal lines is arranged in a corresponding one of the plurality of first unit columns.

In a second aspect, an embodiment of the present disclosure further provides a display apparatus, which includes any one of the display substrates described above.

BRIEF DESCRIPTION OF DRAWINGS

FIG. 8a is a schematic diagram illustrating formation of a pattern of a first conductive layer for a display substrate according to the present disclosure;

FIG. 8b is a schematic plan view of the first conductive layer in FIG. 8a;

FIG. 9a is a schematic diagram illustrating formation of a pattern of a second conductive layer for a display substrate according to the present disclosure;

FIG. 9b is a schematic plan view of the second conductive layer in FIG. 9a;

FIG. 10a is a schematic diagram illustrating formation of a pattern of a fourth insulating layer for a display substrate according to the present disclosure;

FIG. 10b is a schematic plan view of a plurality of vias in FIG. 10a;

FIG. 11b is a schematic plan view of the third conductive layer in FIG. 11a;

FIG. 12b is a schematic plan view of a plurality of vias in FIG. 12a;

FIG. 13a is a schematic diagram illustrating formation of a pattern of a fourth conductive layer for a display substrate according to the present disclosure;

FIG. 13b is a schematic plan view of the fourth conductive layer in FIG. 13a;

FIG. 14a is a schematic diagram illustrating formation of a pattern of a second planarization layer for a display substrate according to the present disclosure;

FIG. 14b is a schematic plan view of a plurality of vias in FIG. 14a;

DETAIL DESCRIPTION OF EMBODIMENTS

In order to enable one of ordinary skill in the art to better understand the technical solutions of the present disclosure, the present disclosure will be further described in detail below with reference to the accompanying drawings and specific embodiments.

Unless defined otherwise, technical or scientific terms used herein shall have the ordinary meaning as understood by one of ordinary skill in the art to which this disclosure belongs. The use of "first", "second", and the like in the present disclosure is not intended to indicate any order, quantity, or importance, but rather serves to distinguish one element from another. Also, the term "a", "an", "the" or the like does not denote a limitation of quantity, but rather denotes the presence of at least one. The word "comprising", "comprises", or the like means that the element or item preceding the word includes the element or item listed after the word and its equivalent, but does not exclude other elements or items. The term "connected", "coupled" or the like is not restricted to physical or mechanical connections, but may include electrical connections, whether direct or indirect. The terms "upper", "lower", "left", "right", and the like are used only to indicate relative positional relationships, and when the absolute position of the object being described is changed, the relative positional relationships may also be changed accordingly.

Figure 1:
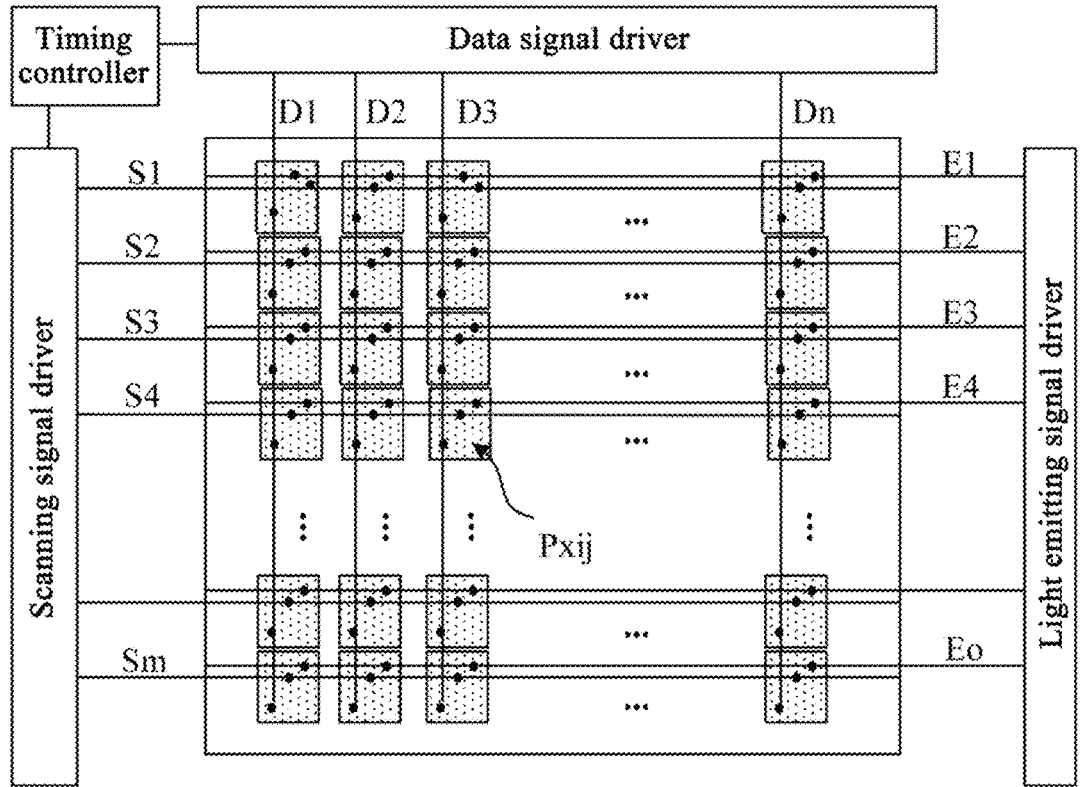
FIG. 1 is a schematic diagram of a structure of a display apparatus.

FIG. 1 is a schematic diagram of a structure of a display apparatus. As shown in FIG. 1, the display apparatus may include a timing controller, a data driver, a scanning driver, a light emitting driver, and a pixel array. The timing controller is connected to the data driver, the scanning driver, and the light emitting driver, the data driver is connected to a plurality of data signal lines (D1 to Dn), respectively, the scanning driver is connected to a plurality of scanning signal lines (S1 to Sm), and the light emitting driver is connected to a plurality of light emitting signal lines (E1 to Eo). The pixel array may include a plurality of sub-pixels Pxij, where i and j may be natural numbers. At least one sub-pixel Pxij may include a circuit unit and a light emitting device connected to the circuit unit. The circuit unit may include at least one scanning signal line, at least one data signal line, at least one light emitting signal line and a pixel driving circuit. In an exemplary embodiment, the timing controller may provide a gray value and a control signal suitable for the specification of the data driver to the data driver, may provide a clock signal, a scanning start signal, and the like, suitable for the specification of the scanning driver to the scanning driver, and may provide a clock signal, an emitting stop signal, and the like, suitable for the specification of the light emitting driver to the light emitting driver. The data driver may generate data voltages to be provided to the data signal lines D1, D2, D3, . . . , and Dn using the gray values and the control signals received from the timing controller. For example, the data driver may sample the gray values using the clock signals and apply data voltages corresponding to the gray values to the data signal lines D1 to Dn in unit of one pixel row, where n may be a natural number. The scanning driver may generate scanning signals to be provided to the scanning signal lines S1, S2, S3, . . . , and Sm by receiving clock signals, a scanning start signal, and the like, from the timing controller. For example, the scanning driver may sequentially provide scanning signals having an on-level pulse to the scanning signal lines S1 to Sm, where m may be a natural number. For example, the scanning driver may be configured in the form of a shift register, and may generate the scanning signals in such a manner that scanning start signal provided in the form of on-level pulse is sequentially transmitted to circuits in subsequent stages under the control of the clock signals. The light emitting driver may generate emitting signals to be provided to the light emitting signal lines E1, E2, E3, . . . , and Eo by receiving clock signals, an emitting stop signal, and the like from the timing controller. For example, the light emitting driver may sequentially provide emitting signals having an off-level pulse to the light emitting signal lines E1 to Eo. For example, the light emitting driver may be configured in the form of a shift register, and may generate the emitting signal in such a manner that the emitting stop signal provided in the form of off-level pulse is sequentially transmitted to the circuits in subsequent stages under the control of the clock signals, where o may be a natural number.

Figure 2A:
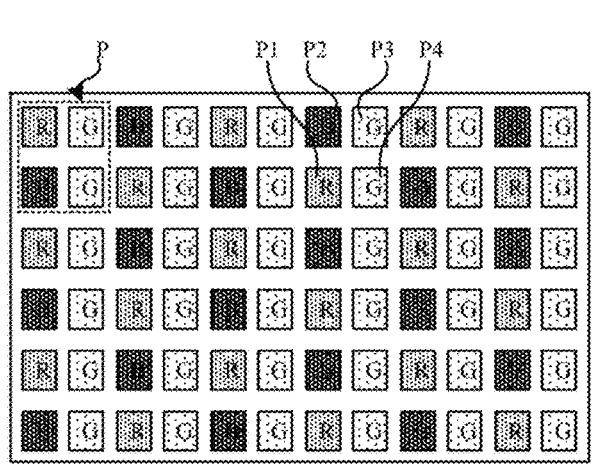
FIG. 2 is a schematic plan view of a structure of a display substrate.
Figure 2B:
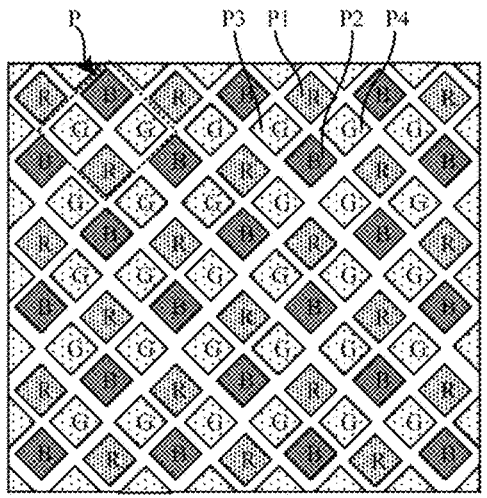

FIGS. 2a and 2b each are a schematic plan view of a structure of a display substrate. In an exemplary embodiment, the display substrate may include a plurality of pixel units P arranged in an array. At least one of the plurality of pixel units P may each include one first sub-pixel P1 emitting light of a first color, one second sub-pixel P2 emitting light of a second color, and two sub-pixels, i.e., one third sub-pixel P3 and one fourth sub-pixel P4 emitting light of a third color. The four sub-pixels may each include a circuit unit and a light emitting device. The circuit unit may include a scanning signal line, a data signal line, a light emitting signal line, and a pixel driving circuit. The pixel driving circuit is connected to the scanning signal line, the data signal line, and the light emitting signal line, and the pixel driving circuit is configured to receive a data voltage transmitted from the data signal line and output a corresponding current to the light emitting device under the control of the scanning signal line and the light emitting signal line. The light emitting device in each sub-pixel is connected to the pixel driving circuit of the sub-pixel, and the light emitting device is configured to emit light with a corresponding brightness in response to the current output by the pixel driving circuit of the sub-pixel.

In an exemplary embodiment, the first sub-pixel P1 may be a red sub-pixel (R) emitting red light, the second sub-pixel P2 may be a blue sub-pixel (B) emitting blue light, and the third sub-pixel P3 and the fourth sub-pixel P4 may each be a green sub-pixel (G) emitting green light. In an exemplary embodiment, the shape of the sub-pixel may be a rectangle, a diamond, a pentagon, or a hexagon. In an exemplary embodiment, the four sub-pixels may be arranged in a square format to form a GGRB pixel arrangement, as shown in FIG. 2a. In another exemplary embodiment, the four sub-pixels may be arranged in a diamond format to form a RGBG pixel arrangement, as shown in FIG. 2b. In other exemplary embodiments, the four sub-pixels may be arranged side-by-side in a horizontal or vertical direction. In an exemplary embodiment, the pixel unit may include three sub-pixels, and the three sub-pixels may be arranged side-by-side in a horizontal or vertical direction, or may be arranged in a delta format, which are not limited in the present disclosure.

In an exemplary embodiment, a plurality of sub-pixels sequentially arranged in a horizontal direction are referred to as a pixel row, a plurality of sub-pixels sequentially arranged in a vertical direction are referred to as a pixel column, and a plurality of pixel rows and a plurality of pixel columns constitute a pixel array arranged in an array.

Figure 3:
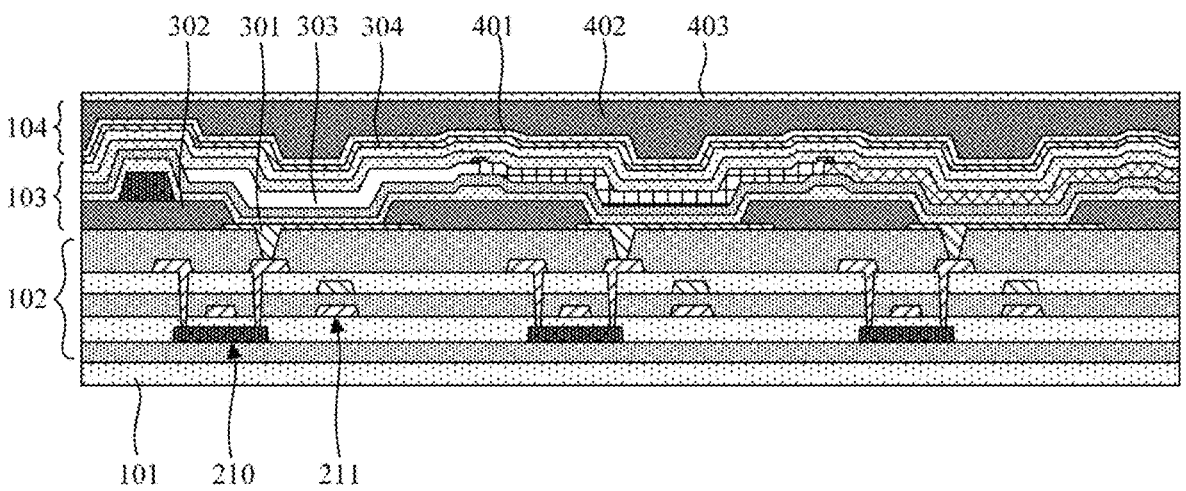
FIG. 3 is a schematic cross-sectional view of a structure of a display substrate.

FIG. 3 is a schematic cross-sectional view of a display substrate, illustrating a structure of three sub-pixels of the display substrate. As shown in FIG. 3, in a plane perpendicular to the display substrate, the display substrate may include a driving circuit layer 102 arranged on a base substrate 101, a light emitting structure layer 103 arranged on a side of the driving circuit layer 102 away from the base substrate, and an encapsulation layer 104 arranged on a side of the light emitting structure layer 103 away from the base substrate. In some possible implementations, the display substrate may include other layers, such as spacer pillars, and the like, which are not limited in the present disclosure.

In an exemplary embodiment, the base substrate 101 may be a flexible substrate, or a rigid substrate. The driving circuit layer 102 of each sub-pixel may include a plurality of signal lines and a pixel driving circuit. The pixel driving circuit may include a plurality of transistors and a storage capacitor, which are illustrated in FIG. 3 by taking only one driving transistor 210 and one storage capacitor 211 as an example. The light emitting structure layer 103 of each sub-pixel may include a plurality of layers constituting a light emitting device, and the plurality of layers may include an anode 301, a pixel defining layer 302, an organic light emitting layer 303, and a cathode 304. The anode 301 is connected to a drain electrode of the driving transistor 210 through a via. The organic light emitting layer 303 is connected to the anode 301. The cathode 304 is connected to the organic light emitting layer 303. The organic light emitting layer 303 emits light of a corresponding color under the driving of the anode 301 and the cathode 304. The encapsulation layer 104 may include a first encapsulation layer 401, a second encapsulation layer 402, and a third encapsulation layer 403, which are stacked together. The first encapsulation layer 401 and the third encapsulation layer 403 may be made of an inorganic material, and the second encapsulation layer 402 may be made of an organic material. The second encapsulation layer 402 is arranged between the first encapsulation layer 401 and the third encapsulation layer 403, so as to ensure that external moisture cannot enter the light emitting structure layer 103.

In an exemplary embodiment, the organic light emitting layer 303 may include a hole injection layer (HIL), a hole transport layer (HTL), an electron blocking layer (EBL), an emission layer (EML), a hole blocking layer (HBL), an electron transport layer (ETL), and an electron injection layer (EIL), which are stacked together. In an exemplary embodiment, the hole injection layers of all the sub-pixels may be an inter-connected common layer, the electron injection layers of all the sub-pixels may be an inter-connected common layer, the hole transport layers of all the sub-pixels may be an inter-connected common layer, the electron transport layers of all the sub-pixels may be an inter-connected common layer, the hole blocking layers of all the sub-pixels may be an inter-connected common layer, and the emission layers of two adjacent sub-pixels may overlap slightly, or may be isolated from each other, and the electron blocking layers of two adjacent sub-pixels may overlap slightly, or may be isolated from each other.

Figure 4A:
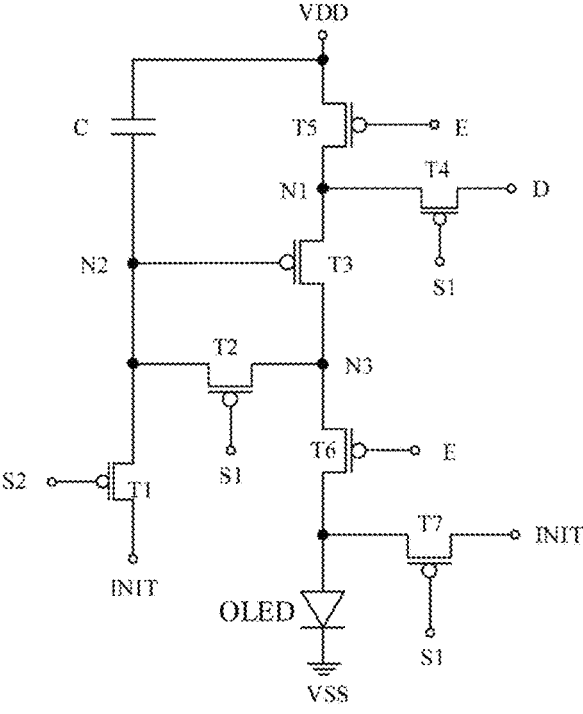
FIG. 4a is a schematic diagram illustrating an equivalent circuit of a pixel driving circuit.

In an exemplary embodiment, the pixel driving circuit may be a 3T1C, 4T1C, 5T1C, 5T2C, 6T1C, 7T1C, or 8T1C structure. FIG. 4 is a schematic diagram illustrating an equivalent circuit of a pixel driving circuit. As shown in FIG. 4, the pixel driving circuit may include seven transistors (a first transistor T1, a second transistor T2, a third transistor T3, a fourth transistor T4, a fifth transistor T5, a sixth transistor T6, and a seventh transistor T7) and one storage capacitor C. The pixel driving circuit is connected to seven signal lines (a data signal line D, a first scanning signal line S1, a second scanning signal line S2, a light emitting signal line E, an initial signal line INIT, a first power supply line VDD, and a second power supply line VSS).

In an exemplary embodiment, the pixel driving circuit may include a first node N1, a second node N2, and a third node N3. The first node N1 is connected to a first electrode of the third transistor T3, a second electrode of the fourth transistor T4 and a second electrode of the fifth transistor T5. The second node N2 is connected to a second electrode of the first transistor, a first electrode of the second transistor T2, a control electrode of the third transistor T3 and a second terminal of the storage capacitor C. The third node N3 is connected to a second electrode of the second transistor T2, a second electrode of the third transistor T3 and a first electrode of the sixth transistor T6.

In an exemplary embodiment, a first terminal of the storage capacitor C is connected to the first power supply line VDD, and the second terminal of the storage capacitor C is connected to the second node N2, that is, the second terminal of the storage capacitor C is connected to the control electrode of the third transistor T3.

A control electrode of the first transistor T1 is connected to the second scanning signal line S2, a first electrode of the first transistor T1 is connected to the initial signal line INIT, and the second electrode of the first transistor is connected to the second node N2. When a scanning signal of a turn-on level is applied to the second scanning signal line S2, the first transistor T1 transmits an initial voltage to the control electrode of the third transistor T3 to initialize charges at the control electrode of the third transistor T3.

A control electrode of the second transistor T2 is connected to the first scanning signal line S1, the first electrode of the second transistor T2 is connected to the second node N2, and the second electrode of the second transistor T2 is connected to the third node N3. When a scanning signal of a turn-on level is applied to the first scanning signal line S1, the second transistor T2 connects the control electrode of the third transistor T3 to the second electrode.

The control electrode of the third transistor T3 is connected to the second node N2, that is, the control electrode of the third transistor T3 is connected to the second terminal of the storage capacitor C. The first electrode of the third transistor T3 is connected to the first node N1, and the second electrode of the third transistor T3 is connected to the third node N3. The third transistor T3 may be referred to as a driving transistor, and the third transistor T3 determines a magnitude of a driving current flowing between the first power supply line VDD and a second power supply line VSS according to a potential difference between the control electrode and the first electrode of third transistor T3.

A control electrode of the fourth transistor T4 is connected to the first scanning signal line S1, a first electrode of the fourth transistor T4 is connected to the data signal line D, and the second electrode of the fourth transistor T4 is connected to the first node N1. The fourth transistor T4 may be referred to as a switch transistor, a scanning transistor, or the like. When a scanning signal of a turn-on level is applied to the first scanning signal line S1, the fourth transistor T4 inputs a data voltage of the data signal line D to the pixel driving circuit.

A control electrode of the fifth transistor T5 is connected to the light emitting signal line E, a first electrode of the fifth transistor T5 is connected to the first power supply line VDD, and the second electrode of the fifth transistor T5 is connected to the first node N1. A control electrode of the sixth transistor T6 is connected to the light emitting signal line E, the first electrode of the sixth transistor T6 is connected to the third node N3, and a second electrode of the sixth transistor T6 is connected to a first electrode of the light emitting device. The fifth transistor T5 and the sixth transistor T6 may be referred to as light emitting transistors. When a light emitting signal of a turn-on level is applied to the light emitting signal line E, the fifth transistor T5 and the sixth transistor T6 cause the light emitting device to emit light by forming a driving current path between the first power supply line VDD and the second power supply line VSS.

A control electrode of the seventh transistor T7 is connected to the first scanning signal line S1, a second electrode of the seventh transistor T7 is connected to the initial signal line INIT, and a first electrode of the seventh transistor T7 is connected to the first electrode of the light emitting device. When a scanning signal of a turn-on level is applied to the first scanning signal line S1, the seventh transistor T7 transmits the initial voltage to the first electrode of the light emitting device to initialize or release the accumulated charges at the first electrode of the light emitting device.

In an exemplary embodiment, the light emitting device may be an OLED including a first electrode (anode), an organic light emitting layer, and a second electrode (cathode) stacked together, or may be a QLED including a first electrode (anode), a quantum dot light emitting layer, and a second electrode (cathode) stacked together.

In an exemplary embodiment, a second electrode of the light emitting device is connected to the second power supply line VSS. The signal of the second power supply line VSS is a low-level signal, and the signal of the first power supply line VDD is a high-level signal. The first scanning signal line S1 is a scanning signal line of the pixel driving circuits in the current display row, and the second scanning signal line S2 is a scanning signal line of the pixel driving circuits in the previous display row. That is, for an $n^{th}$ display row, the first scanning signal line S1 is S(n), the second scanning signal line S2 is S(n−1). The second scanning signal line S2 in the current display row and the first scanning signal line S1 of the pixel driving circuits in the previous display row are the same signal line, which can reduce the number of the signal lines of the display panel and realize the narrow bezel of the display panel.

In an exemplary embodiment, the first to seventh transistors T1 to T7 may be P-type transistors or may be N-type transistors. The same type of transistors are adopted in the pixel driving circuit, so that the process flow can be simplified, the process difficulty in manufacturing the display panel can be reduced, and the yield of product can be improved. In some possible implementations, the first to seventh transistors T1 to T7 may include P-type transistors and N-type transistors.

In exemplary embodiments, the first to seventh transistors T1 to T7 each may adopt a low temperature poly-silicon thin film transistor, or each may adopt an oxide thin film transistor, or the first to seventh transistors T1 to T7 may adopt both a low temperature poly-silicon thin film transistor and an oxide thin film transistor. An active layer of the low temperature poly-silicon thin film transistor adopts low temperature poly-silicon (LTPS), and the active layer of the oxide thin film transistor adopts oxide semiconductor (Oxide). The low temperature poly-silicon thin film transistor has the advantages of high mobility, high charging speed and the like, and the oxide thin film transistor has the advantages of low leakage current and the like. The low temperature poly-silicon thin film transistor and the oxide thin film transistor may be integrated in one display substrate to form a low temperature polycrystalline oxide (LTPO) display substrate, the advantages of both the low temperature poly-silicon thin film transistor and the oxide thin film transistor can be utilized, low-frequency driving can be realized, power consumption can be reduced, and display quality can be improved.

Figure 4B:
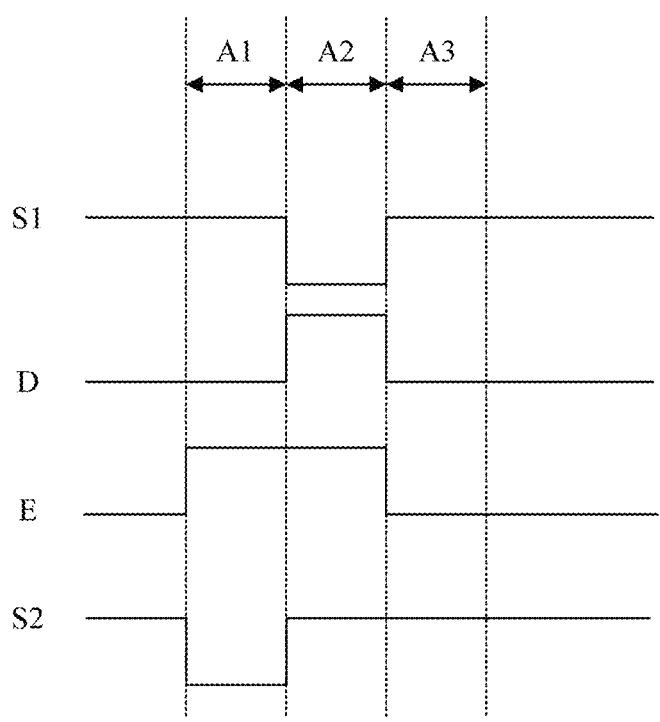
FIG. 4b is a timing diagram illustrating an operation of a pixel driving circuit.

FIG. 4b is a timing diagram illustrating an operation of a pixel driving circuit. The exemplary embodiment of the present disclosure will be explained below taking an operation process of the pixel driving circuit illustrated in FIG. 4a. The pixel driving circuit in FIG. 4a includes seven transistors (the first to seventh transistors T1 to T7), one storage capacitor C, and seven signal lines (the data signal line D, the first scanning signal line S1, the second scanning signal line S2, the light emitting signal line E, the initial signal line INIT, the first power supply line VDD, and the second power supply line VSS), where the seven transistors are all P-type transistors.

In an exemplary embodiment, taking an OLED as an example, the operating process of the pixel driving circuit may include the following phases A1 to A3.

In a first phase A1, which is referred to as a reset phase, a signal of the second scanning signal line S2 is a low-level signal, and signals of the first scanning signal line S1 and the light emitting signal line E are high-level signals. The signal of the second scanning signal line S2 is a low-level signal, so that the first transistor T1 is turned on, and the signal of the initial signal line INIT is provided to the second node N2, to initialize the storage capacitor C and clear the original data voltage in the storage capacitor. The signals of the first scanning signal line S1 and the light emitting signal line E are high-level signals, so that the second transistor T2, the fourth transistor T4, the fifth transistor T5, the sixth transistor T6, and the seventh transistor T7 are turned off. In this phase, the OLED does not emit light.

In the second phase A2, which is referred to as a data writing phase or a threshold compensation phase, the signal of the first scanning signal line S1 is a low-level signal, the signals of the second scanning signal line S2 and the light emitting signal line E are high-level signals, and the data signal line D outputs a data voltage. In this phase, the second terminal of the storage capacitor C is at a low level, so that the third transistor T3 is turned on. The signal of the first scanning signal line S1 is a low-level signal, so that the second transistor T2, the fourth transistor T4, and the seventh transistor T7 are turned on. The second transistor T2 and the fourth transistor T4 are turned on, so that the data voltage output by the data signal line D is provided to the second node N2 through the first node N1, the turned-on third transistor T3, the third node N3, and the turned-on second transistor T2, and the data voltage output by the data signal line D minus the threshold voltage of the third transistor T3 is charged in the storage capacitor C, the voltage at the second terminal of the storage capacitor C (the second node N2) is Vd−|Vth|, where Vd is the data voltage output by the data signal line D, and Vth is the threshold voltage of the third transistor T3. The seventh transistor T7 is turned on, so that an initial voltage of the initial signal line INIT is provided to the first electrode of the OLED, to initialize (reset) the first electrode of the OLED, empty the pre-stored voltage therein, complete the initialization, and ensure that the OLED does not emit light. The signal of the second scanning signal line S2 is a high-level signal, so that the first transistor T1 is turned off. The signal of the light emitting signal line E is a high-level signal, so that the fifth transistor T5 and the sixth transistor T6 are turned off.

In a third phase A3, which is referred to as a light emitting phase, a signal of the light emitting signal line E is a low-level signal, and signals of the first scanning signal line S1 and the second scanning signal line S2 are high-level signals. The signal of the light emitting signal line E is a low-level signal, so that the fifth transistor T5 and the sixth transistor T6 are turned on, and the power supply voltage output by the first power supply line VDD is provided as a driving voltage to the first electrode of the OLED through the turned-on fifth transistor T5, the turned-on third transistor T3 and the turned-on sixth transistor T6, so that the OLED is driven to emit light.

During the driving of the pixel driving circuit, the driving current flowing through the third transistor T3 (driving transistor) is determined by a difference between voltages at the gate electrode and the first electrode of the third transistor T3. Since the voltage at the second node N2 is Vdata−|Vth|, the driving current of the third transistor T3 is:

$$I = K(Vgs - Vth)^2 = K[(Vdd - Vd + |Vth|) - Vth]^2 = K[(Vdd - Vd)]^2,$$

Where I is the driving current flowing through the third transistor T3, that is, a driving current driving the OLED, K is a constant, Vgs is a difference between voltages at the gate electrode and the first electrode of the third transistor T3, Vth is a threshold voltage of the third transistor T3, Vd is a data voltage output from the data signal line D, and Vdd is a power voltage output from the first power supply line Vdd.

Figure 5:
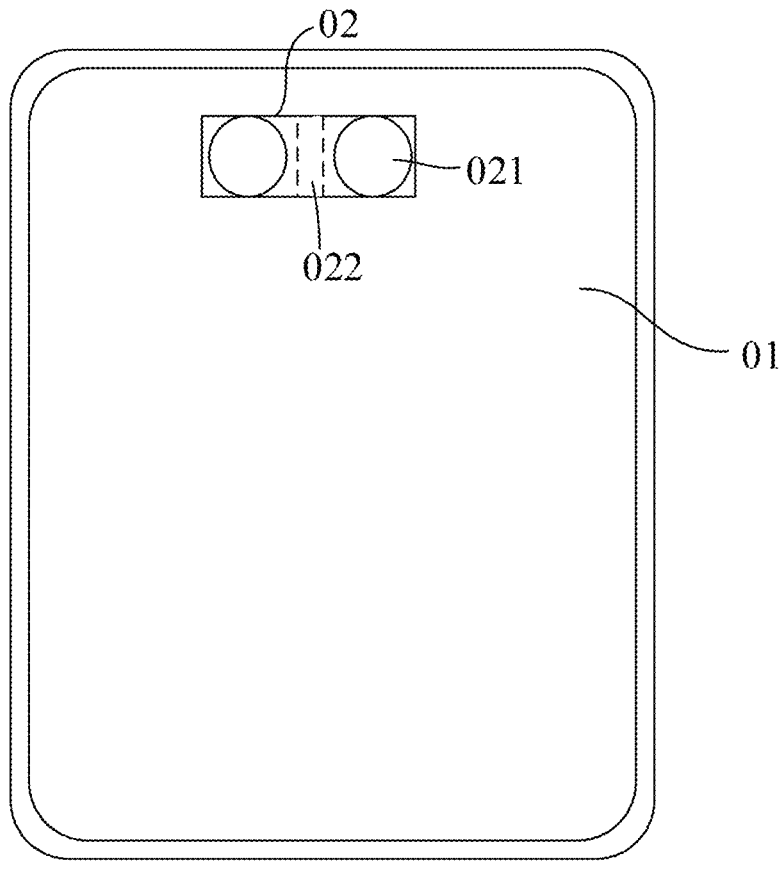
FIG. 5 is a schematic diagram of a layout of a display substrate according to an embodiment of the present disclosure.

FIG. 5 is a schematic diagram of a part of a display substrate according to an embodiment of the present disclosure. As shown in FIG. 5, the display substrate includes a display region 01 and a dummy pixel region 02, where the dummy pixel region 02 is provided with at least one pixel missing region 021 (two pixel missing regions 021 are taken as an example in FIG. 5) and a redundant region 022 adjacent to the at least one pixel missing region 021. The base substrate at the pixel missing region 021 (also referred to as a through-hole region 021) is provided with a through hole therethrough for arranging a sensor such as a camera, so that there is no display device (including the pixel driving circuit and the light emitting device) in the pixel missing region 021. The redundant region 022 is usually provided with a pixel driving circuit but not provided with a light emitting device, in order to avoid poor display uniformity of the display panel due to the arrangement of the pixel missing region 021. However, due to the arrangement of the pixel missing region, the problem of non-uniform display between pixels in the rows where the pixel missing region 021 is located and the other positions of the display region 01 still exists. For example, due to the arrangement of the pixel missing region 021, parts of the first scanning signal line S1 and the second scanning signal line S2 on two sides of the pixel missing region 021 each are transversely connected together through a winding line in a first conductive layer, parts of the initial signal line INIT on two sides of the pixel missing region 021 are transversely connected through a winding line in a second conductive layer, and parts of the data line signal line D on two sides of the pixel missing region 021 are vertically connected together through a winding line in a third conductive layer, so that the parts of the first scanning signal line S1, the second scanning signal line S2 and the initial signal line INIT on the left and right sides of the dummy pixel region 02 each are left-right connected together, and parts of the data signal line D are up-down connected together. These winding lines make the loading on the initial signal line INIT greatly different from that in a normal region, the loading on the initial signal line INIT with the through-hole region 021 is lower, the voltage at the node N4 of the pixel is lower, the current is finally lower, and the display is darker.

In view of the above problems, the embodiments of the present disclosure provide the following technical solutions.

Figure 6A:
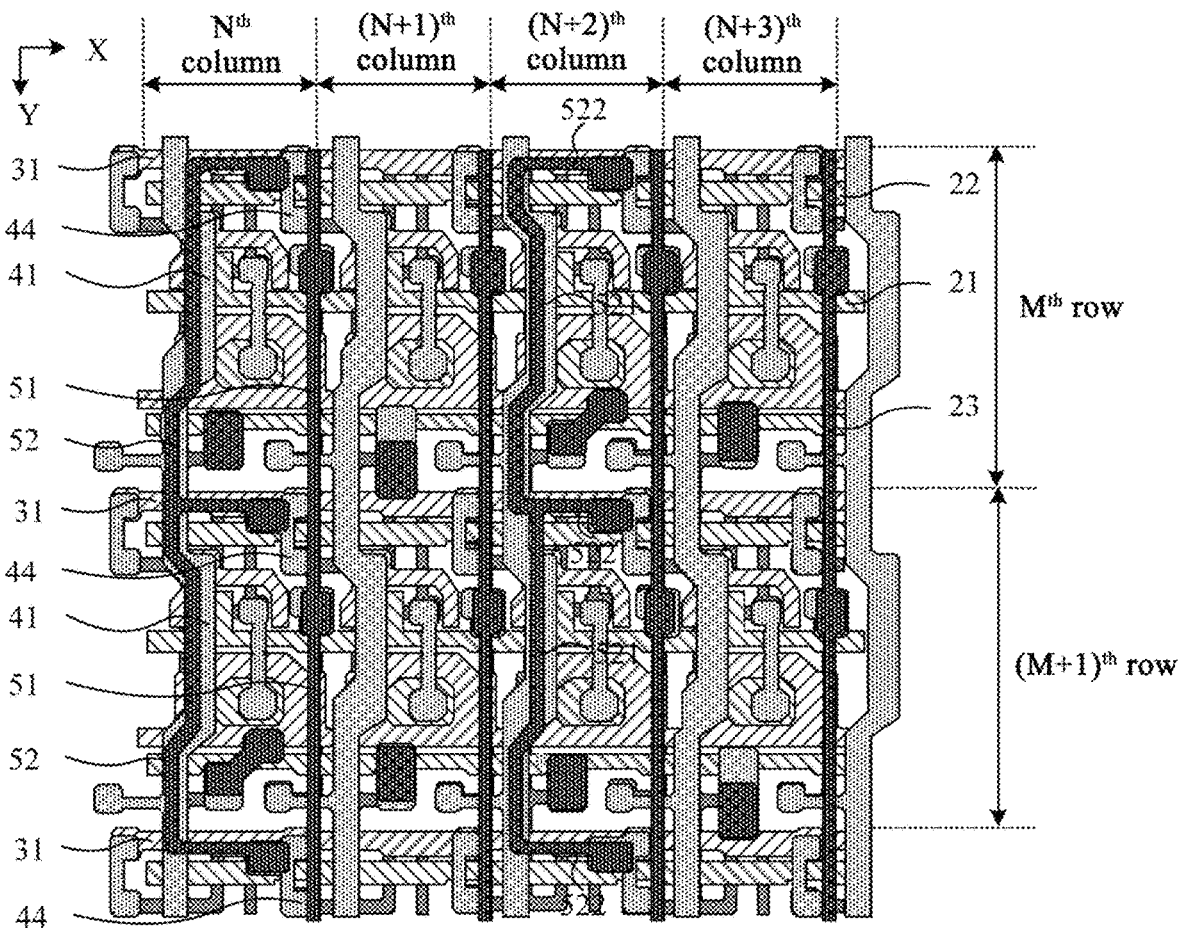
FIG. 6a is a schematic diagram of a structure of a display substrate according to an exemplary embodiment of the present disclosure.

In a first aspect, FIG. 6a is a schematic diagram illustrating a structure of a driving circuit layer according to an exemplary embodiment of the present disclosure. As shown in FIGS. 5 and 6a, a display substrate having a display region 01 and a dummy pixel region 02 surrounded by the display region 01 is provided in an embodiment of the present disclosure. The display substrate includes a base substrate, and a driving circuit layer and a light emitting structure layer which are sequentially arranged on the base substrate. The driving circuit layer includes a plurality of circuit units; the plurality of circuit units in the driving circuit layer may form a plurality of unit rows arranged side by side in a second direction and a plurality of unit columns arranged side by side in a first direction. The circuit units in each unit row are arranged side by side in the first direction X, and the circuit units in each unit column are arranged side by side in the second direction Y. The light emitting structure layer includes a plurality of light emitting devices located in the display region 01.

In some examples, at least one circuit unit includes a pixel driving circuit and an initial signal line. The pixel driving circuit is electrically connected to a light emitting device. For example, the pixel driving circuits are connected to the light emitting devices in a one-to-one correspondence. The pixel driving circuit may include a plurality of transistors and a storage capacitor. In some examples, the initial signal line is configured to initialize (reset) at least one of the first electrode of the storage capacitor in the pixel driving circuit and/or a first electrode of the light emitting device.

In some examples, the initial signal lines in at least one circuit unit may include a first initial signal line 31 having a main portion extending in the first direction X and a second initial signal line 52 having a main portion extending in the second direction Y, and the first initial signal line 31 and the second initial signal line 52 are connected together through a via. In the present disclosure, the term "A extending in a B direction" means that A may include a main portion and a secondary portion connected to the main portion, the main portion is a line, a line segment or a bar-shaped body, the main portion extends in the B direction, and an extension length of the main portion in the B direction is greater than an extension length of the secondary part extending in each of other directions.

In some examples, in at least one circuit unit, the second initial signal line 52 may include an extension part 521 and a connection part 522 connected to each other, a main portion of the extension part 521 extends in the second direction Y, and a main portion of the connection part 522 extends in the first direction X. In an exemplary embodiment, an end of the connection part on a side away from the extension part 521 may be connected to the first initial signal line 31 through a via. In some examples, an orthographic projection of at least a part of the connection part 522 on the base substrate is within an orthographic projection of the first initial signal line 31 on the base substrate. In some examples, an orthographic projection of at least a part of the extension 521 on the base substrate is within an orthographic projection of the first power supply line 41 on the base substrate.

Figure 6B:
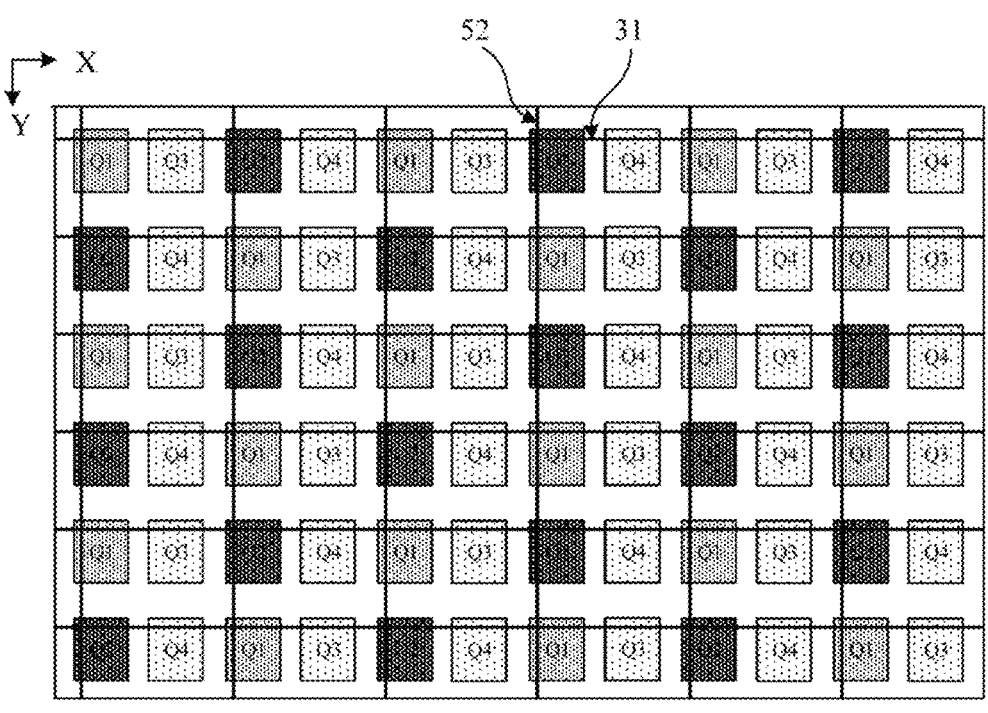
FIG. 6b is a schematic diagram of initial signal lines in a display substrate according to an exemplary embodiment of the present disclosure.

FIG. 6b is a schematic diagram of initial signal lines in a driving circuit layer according to an exemplary embodiment of the present disclosure. As shown in FIG. 6b, the driving circuit layer may include a plurality of unit rows and a plurality of unit columns, and each unit row may be provided with one first initial signal line. The second initial signal lines may be arranged in unit columns at intervals, i.e., two second initial signal lines adjacent to each other in the first direction X are spaced apart by at least one unit column. In an exemplary embodiment, a direction of the unit row may be the first direction X, and a direction of the unit column may be the second direction Y.

In some examples, the plurality of sub-pixels in the display substrate may include a red sub-pixel R emitting red light, a blue sub-pixel B emitting blue light, a first green sub-pixel G1 emitting green light, and a second green sub-pixel G2 emitting green light. The red sub-pixel R may include a red light emitting device emitting red light and a first circuit unit Q1 connected to the red light emitting device, the blue sub-pixel B may include a blue light emitting device emitting blue light and a second circuit unit Q2 connected to the blue light emitting device, the first green sub-pixel G1 may include a first green light emitting device emitting green light and a third circuit unit Q3 connected to the first green light emitting device, and the second green sub-pixel G2 may include a second green light emitting device emitting green light and a fourth circuit unit Q4 connected to the second green light emitting device. The first circuit unit Q1, the second circuit unit Q2, the third circuit unit Q3 and the fourth circuit unit Q4 constitute one circuit unit group. Four circuit units in at least one circuit unit group may be arranged in a square format, that is, four circuit units are arranged in two unit rows and two unit columns. The sub-pixels in the present disclosure refer to regions divided in terms of the light emitting devices, and the circuit units in the present disclosure refer to regions divided in terms of the pixel driving circuits. In an exemplary embodiment, the positions of both the sub-pixels and the circuit units may be corresponding to each other, or the positions of both the sub-pixels and the circuit units may be non-corresponding to each other.

In some examples, the plurality of unit columns may include a first unit column, which refers to a column formed of the plurality of first and second circuit units Q1 and Q2, and a second unit column, which refers to a column formed of the plurality of third and fourth circuit units Q3 and Q4. The first and second circuit units Q1 and Q2 in the first unit column are alternately arranged along the second direction Y, and the third and fourth circuit units Q3 and Q4 in the second unit column are alternately arranged along the second direction Y.

In an exemplary embodiment, the second initial signal line 52 may be arranged in the first unit column. For example, the N$^{th}$ unit column and the (N+2)$^{th}$ unit column are the first unit columns, and the (N+1)$^{th}$ unit column and the (N+3)$^{th}$ unit column may be the second unit columns, and then the second initial signal lines 52 may be arranged in the N$^{th}$ unit column, the (N+2)$^{th}$ unit column, the (N+4)$^{th}$ unit column, . . . , and the second initial signal line 52 may be repeated every other second unit column.

In another exemplary embodiment, the second initial signal line 52 may be arranged in the second unit column. For example, the N$^{th}$ unit column and the (N+2)$^{th}$ unit column are the first unit columns, and the (N+1)$^{th}$ unit column and the (N+3)$^h$ unit column may be the second unit columns, and then the second initial signal lines 52 may be arranged in the (N+1)$^{th}$ unit column, the (N+3)$^{th}$ unit column, the (N+5)$^{th}$ unit column, . . . , and the second initial signal line 52 may be repeated every other first unit column.

In yet another exemplary embodiment, the second initial signal lines 52 may be arranged in both the first unit column and the second unit column.

In an exemplary embodiment, the N$^{th}$ unit column and the (N+2)$^{th}$ unit column may be the first unit columns, and the (N+1)$^{th}$ unit column and the (N+3)$^{th}$ unit column may be the second unit columns. In the N$^{th}$ unit column, the circuit unit in the M$^{th}$ row is a first circuit unit, and the circuit unit in the (M+1)$^{th}$ row is a second circuit unit, so that the first circuit units and the second circuit units in the N$^{th}$ unit column are alternately arranged along the second direction Y. In the (N+2)$^{th}$ unit column, the circuit unit in the M$^{th}$ row is the second circuit unit, and the circuit unit in the (M+1)$^{th}$ row is the first circuit unit, so that the second circuit units and the first circuit units in the (N+2) unit column are alternately arranged along the second direction Y.

In some examples, since the circuit unit in M$^{th}$ row and N$^{th}$ column and the circuit unit in (M+1)$^{th}$ row and (N+2)$^{th}$ column are both first circuit units, a shape of the second initial signal line in the circuit unit in M$^{th}$ row and N$^{th}$ column and a shape of the second initial signal line in the circuit unit in (M+1)$^{th}$ row and (N+2)$^{th}$ may be the same. Since the circuit unit in (M+1)$^{th}$ row and N$^{th}$ column and the circuit unit in M$^{th}$ row and the (N+2)$^{th}$ column are both second circuit units, a shape of the second initial signal line in the circuit unit in (M+1)$^{th}$ row and N$^{th}$ and a shape of the second initial signal line in the circuit unit in M$^{th}$ row and the (N+2)$^{th}$ column may be the same.

In some examples, in the circuit unit in Mth row and Nth column and the circuit unit in (M+1)th row and (N+2)th column, the extension part 521 may include a first initial section, a second initial section, and a third initial section, which are sequentially connected together. The first initial section and the third initial section may be parallel to the second direction Y, a first included angle may exist between the second initial section and the second direction Y, and the first included angle may be greater than 0° and less than 90°. In an exemplary embodiment, an end of the first initial section and/or an end of the third initial section may be connected to the connection part 522.

In some examples, in the circuit unit in Mth row and (N+2)th column and the circuit unit in (M+1)th row and Nth column, the extension part 521 may include a fourth initial section, a fifth initial section, a sixth initial section, a seventh initial section, and an eighth initial section, which are sequentially connected together. The fourth initial section, the sixth initial section, and the eighth initial section may be parallel to the second direction Y, a first included angle may exist between the fifth initial section and the second direction Y, a second included angle may exist between the seventh initial section and the second direction Y, the first angle may be greater than 0° and less than 90°, and the second angle may be greater than 0° and less than 90°. In an exemplary embodiment, an extending direction of the fifth initial section and an extending direction of the seventh initial section may be substantially mirror-symmetrical to each other with respect to the first direction X.

In some examples, the second initial signal lines 52 may be arranged in the first unit columns or the second unit columns at intervals, i.e., two second initial signal lines 52 adjacent to each other in the first direction X are spaced apart by three unit columns. For example, the second initial signal lines 52 may be arranged in the N$^{th}$ unit column, the (N+4)$^{th}$ unit column, the (N+8)$^{th}$ unit column, . . . , and the second initial signal line 52 is repeated every other one first unit column and two second unit columns. Alternatively, the second initial signal lines 52 may be arranged in the (N+1)

unit column, the $(N+5)^{th}$ unit column, the $(N+9)^{th}$ unit column, . . . , and the second initial signal lines 52 is repeated every other tow first unit columns and one second unit column. In an exemplary embodiment, the number of unit columns spacing the adjacent second initial signal lines 52 apart is not particularly required, and may be set according to needs, which is not limited by the present disclosure herein.

In an exemplary embodiment, the driving circuit layer may include a semiconductor layer, a first conductive layer, a second conductive layer, a third conductive layer, and a fourth conductive layer sequentially arranged on the base substrate in a plane perpendicular to the display substrate. The semiconductor layer may include active layers of a plurality of transistors, the first conductive layer may include a scanning signal line and gate electrodes of the plurality of transistors, the second conductive layer may include a first initial signal line 31, the third conductive layer may include a first power supply line and first and second electrodes of the plurality of transistors, and the fourth conductive layer may include a data signal line and the second initial signal line 52.

In some examples, the third conductive layer may further include a second connection electrode 44. The second connection electrode 44 located in the third conductive layer may be connected to the first initial signal line 31 located in the second conductive layer through a via, and the second initial signal line 52 located in the fourth conductive layer may be connected to the second connection electrode 44 located in the third conductive layer through a via. In the present disclosure, the second connection electrode may be referred to as an initial connection electrode.

In some examples, the second connection electrode 44 may be connected to a first region of the active layer of the first transistor and a first region of the active layer of the seventh transistor in the pixel driving circuit through a via.

In some examples, the second conductive layer may further include a shielding electrode 33, and the first power supply line 41 is connected to the shielding electrode through a via. An orthographic projection of at least a part of the shielding electrode 33 on the base substrate is located between an orthographic projection of the data signal line on the base substrate and an orthographic projection of the second electrode of the first transistor in the pixel driving circuit on the base substrate.

In some examples, the driving circuit layer may further include a first scanning signal line 21, a second scanning signal line 22, a light emitting control line 23, and a storage capacitor. The storage capacitor may include a first plate and a second plate, the plurality of transistors may include first to seventh transistors, and the third transistor is a driving transistor.

In some examples, the first conductive layer may include a first scanning signal line 21, a second scanning signal line 22, a light emitting control line 23, a first plate of the storage capacitor, and gate electrodes of a plurality of transistors; the second conductive layer may include a first initial signal line 31, a second plate 32 of the storage capacitor, a shielding electrode 33, and a plate connection line 35; the third conductive layer may include a first power supply line 41, a data connection electrode, a first connection electrode 43, a second connection electrode 44, a third connection electrode 45, and a data connection electrode 43; and the fourth conductive layer may include a data signal line 51, a second initial signal line 52, and an anode connection electrode 53.

In some examples, the driving circuit layer may include a first insulating layer arranged between the base substrate and the semiconductor layer, a second insulating layer arranged between the semiconductor layer and the first conductive layer, a third insulating layer arranged between the first conductive layer and the second conductive layer, a fourth insulating layer arranged between the second conductive layer and the third conductive layer, and a fifth insulating layer arranged between the third conductive layer and the fourth conductive layer.

An exemplary description will be given below through a manufacturing procedure of a display substrate. The term "patterning process" in the present disclosure, for a metal material, an inorganic material, or a transparent conductive material, includes steps of coating a photoresist, exposing with a mask plate, developing, etching, and stripping the photoresist, and for an organic material, includes steps of coating the organic material, exposing with a mask plate, and developing the organic material. A deposition process may adopt any one or more of sputtering, evaporation, and chemical vapor deposition, the coating process may adopt any one or more of spray coating, spin coating, and inkjet printing, and the etching process may adopt any one or more of dry etching and wet etching, which are not limited in the present disclosure. The term "film" is referred to as a layer of a material deposited, coated, or otherwise formed on a base substrate. A "film" may alternatively be referred to as a "layer" if it does not require a patterning process throughout the manufacturing procedure. If a "film" requires a patterning process during the entire manufacturing procedure, the "film" is referred to as a "film" before the patterning process, and referred to as a "layer" after the patterning process. The "layer" after the patterning process includes at least one "pattern". The term "A and B are in a same layer" in the present disclosure means that A and B are formed simultaneously by a same patterning process, and a "thickness" of the film or layer is a dimension of the film or layer in a direction perpendicular to the display substrate. In an exemplary embodiment of the present disclosure, the term "an orthographic projection of B is within an orthographic projection of A" or the term "an orthographic projection of A includes an orthographic projection of B" means that a boundary of the orthographic projection of B falls within a boundary of the orthographic projection of A, or the boundary of the orthographic projection of A overlaps the boundary of the orthographic projection of B.

In some examples, taking eight circuit units (in two unit rows and four unit columns) as an example, the manufacturing procedure of the driving circuit layer may include the following operations.

Figure 7:
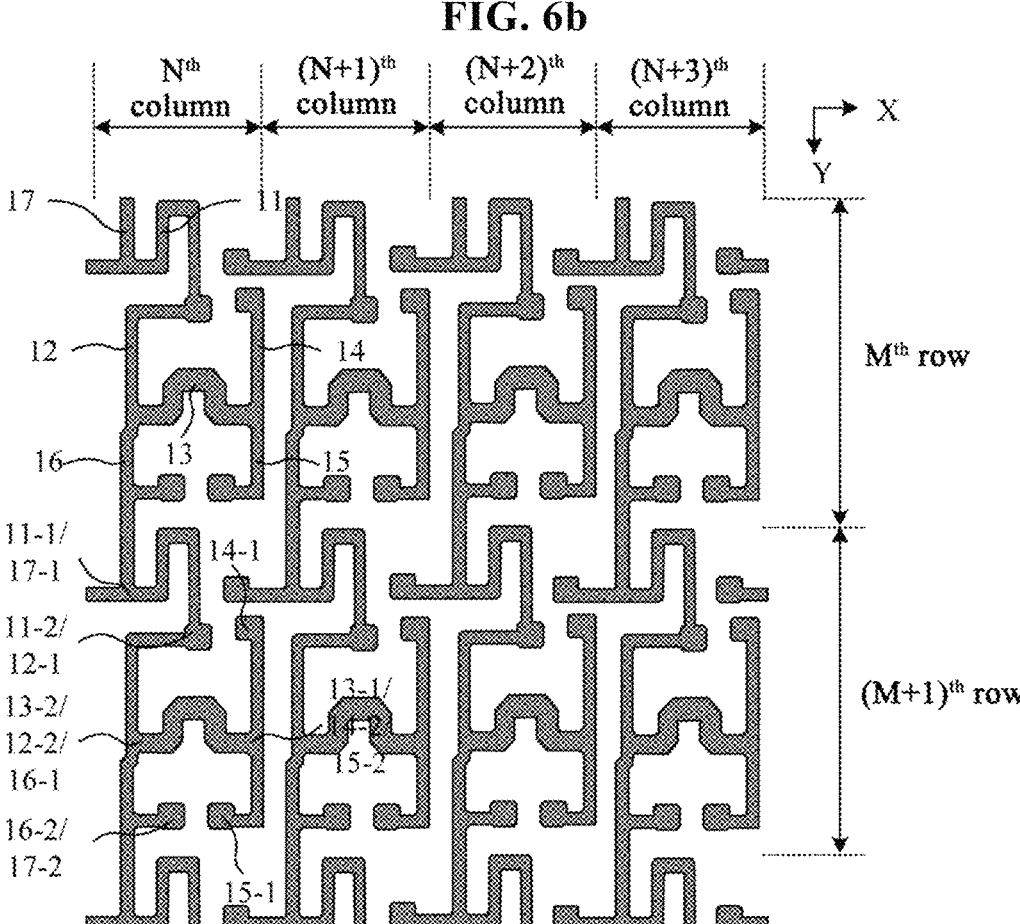
FIG. 7 is a schematic diagram illustrating formation of a pattern of a semiconductor layer for a display substrate according to the present disclosure.

(1) Forming a pattern of a semiconductor layer. In some examples, the forming a pattern of a semiconductor layer may include: sequentially depositing a first insulating film and a semiconductor film on a base substrate, and patterning the semiconductor film through a patterning process, to form a first insulating layer covering the base substrate and a semiconductor layer arranged on the first insulating layer, as shown in FIG. 7.

In some examples, the semiconductor layer of each circuit unit may include a first active layer 11 of the first transistor T1, a second active layer 12 of the second transistor T2, a third active layer 13 of the third transistor T3, a fourth active layer 14 of the fourth transistor T4, a fifth active layer 15 of the fifth transistor T5, a sixth active layer 16 of the sixth transistor T6, and a seventh active layer 17 of the seventh transistor T7, which are of an inter-connected one-piece structure. In each unit column, the sixth active layer 16 of the circuit unit in an $M^{th}$ row and the seventh active layer 17 of the circuit unit in an $(M+1)^{th}$ row are connected to each other. That is, the semiconductor layers of the adjacent circuit units in each unit column are of an inter-connected one-piece structure.

In some examples, as for the circuit unit in the $M^{th}$ row, the first active layer 11, the second active layer 12, the fourth active layer 14, and the seventh active layer 17 are located on a side of the third active layer 13 away from the $(M+1)^{th}$ row of circuit units; and the first active layer 11 and the seventh active layer 17 are located on a side of the second active layer 12 and the fourth active layer 14 away from the third active layer 13; and the fifth active layer 15 and the sixth active layer 16 are located on a side of the third active layer 13 close to the $(M+1)^{th}$ row of circuit units.

In some examples, the first active layer 11 may have an "n" shape, the second active layer 12 may have a "7" shape, the third active layer 13 may have a "Q" shape, the fourth active layer 14 may have a "1" shape, and the fifth, sixth, and seventh active layers 15, 16, and 17 may each have an "L" shape.

In some examples, the active layer of each transistor may include a first region, a second region, and a channel region between the first region and the second region. In an exemplary embodiment, the first region 11-1 of the first active layer 11 also serves as the first region 17-1 of the seventh active layer 17, the second region 11-2 of the first active layer 11 also serves as the first region 12-1 of the second active layer 12, the first region 13-1 of the third active layer 13 also serves as the second region 14-2 of the fourth active layer 14 and the second region 15-2 of the fifth active layer 15, the second region 13-2 of the third active layer 13 also serves as the second region 12-2 of the second active layer 12 and the first region 16-1 of the sixth active layer 16, and the second region 16-2 of the sixth active layer 16 also serves as the second region 17-2 of the seventh active layer 17. In an exemplary embodiment, the first region 14-1 of the fourth active layer 14 and the first region 15-1 of the fifth active layer 15 are separately arranged.

Figures 8A, 8B:
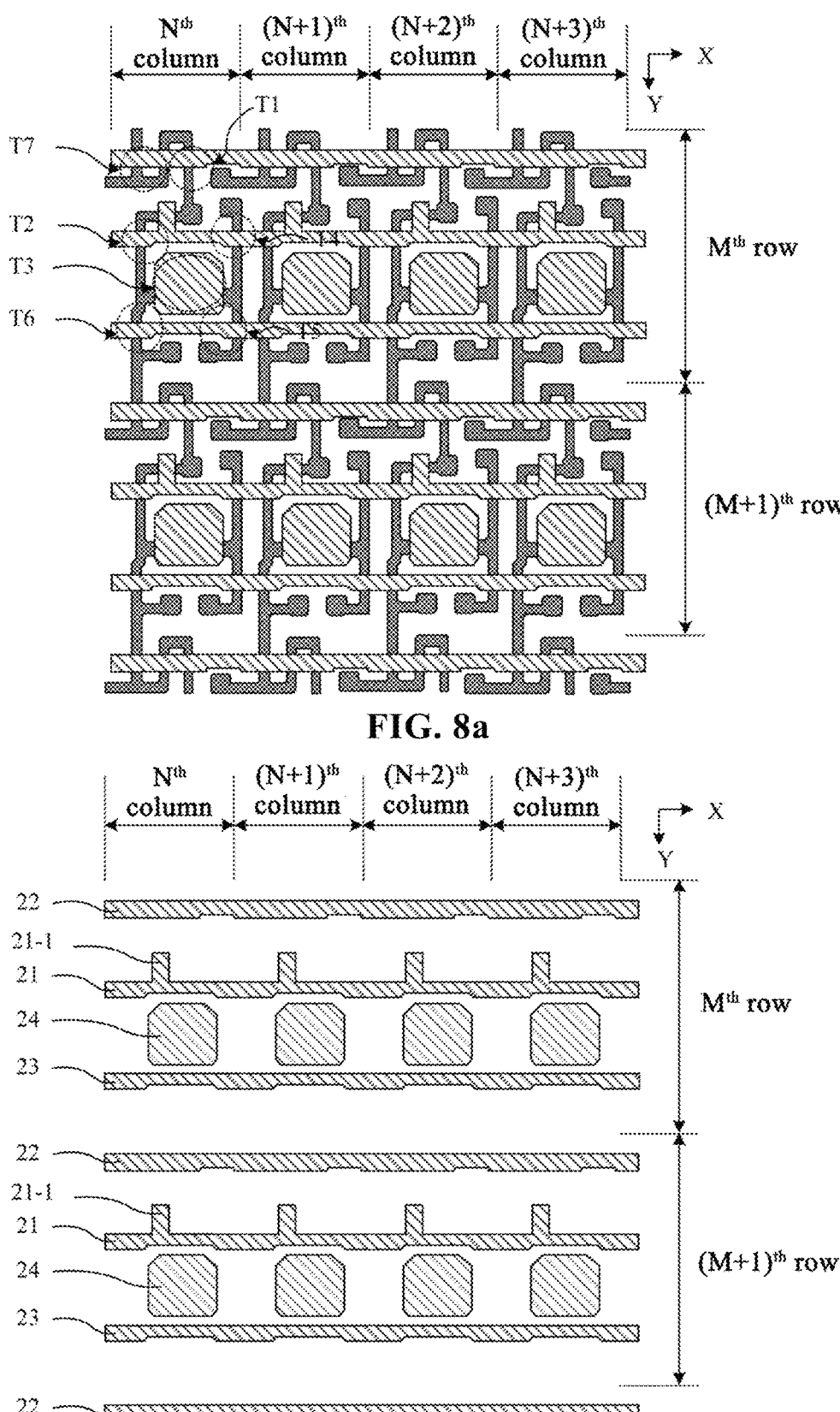

(2) Forming a pattern of a first conductive layer. In some examples, the forming a pattern of a first conductive layer may include: sequentially depositing a second insulating film and a first conductive film on the base substrate with the above described pattern formed thereon, and patterning the first conductive film through a patterning process, to form a second insulating layer covering the pattern of the semiconductor layer and the pattern of the first conductive layer arranged on the second insulating layer. The pattern of the first conductive layer includes, as shown in FIGS. 8a and 8b, at least the first scanning signal line 21, the second scanning signal line 22, the light emitting control line 23, and a first plate 24. FIG. 8b is a schematic plan view of the first conductive layer in FIG. 8a. In some examples, the first conductive layer may be referred to as a first gate metal (GATE1) layer.

In conjunction with FIGS. 7 to 8b, a main portion of the first scanning signal line 21, the second scanning signal line 22, and the light emitting control line 23 may each extend in the first direction X. The first scanning signal line 21 and the second scanning signal line 22 of a circuit unit in the $M^{th}$ row are located on a side of a first plate 24 of this circuit unit away from a circuit unit in the $(M+1)^{th}$ row, the second scanning signal line 22 is located on a side of the first scanning signal line 21 of this circuit unit away from the first plate 24, and the light emitting control line 23 may be located on a side of the first plate 24 of this circuit unit close to the pixel driving circuit in the $(M+1)^{th}$ row.

In some examples, the first plate 24 may have a rectangular shape, corners of the rectangular shape may be chamfered, and an overlapping region exists between an orthographic projection of the first plate 24 on the base substrate and an orthographic projection of the third active layer of the third transistor T3 on the base substrate. In an exemplary embodiment, the first plate 24 may serve as both one plate of the storage capacitor and the gate electrode of the third transistor T3.

In some examples, a region of the first scanning signal line 21 overlapping the second active layer 12 serves as a gate electrode of the second transistor T2. The first scanning signal line 21 is provided with a gate block 21-1 protruding toward the second scanning signal line 22, and an overlapping region exists between an orthographic projection of the gate block 21-1 on the base substrate and an orthographic projection of the second active layer 12 on the base substrate, thereby forming a dual-gate structure of the second transistor T2. A region of the first scanning signal line 21 overlapping the fourth active layer 14 serves as a gate electrode of the fourth transistor T4. A region of the second scanning signal line 22 overlapping the first active layer 11 serves as a gate electrode of the first transistor T1 with a dual-gate structure. A region of the second scanning signal line 22 overlapping the seventh active layer 17 serves as a gate electrode of the seventh transistor T7. A region of the light emitting control line 23 overlapping the fifth active layer 15 serves as a gate electrode of the fifth transistor T5. A region of the light emitting control line 23 overlapping the sixth active layer 16 serves as a gate electrode of the sixth transistor T6.

In some examples, after the pattern of the first conductive layer is formed, a part of the semiconductor layer is treated to become a conductor with the first conductive layer as a mask. Channel regions of the first to seventh transistors T1 to T7 are formed by regions of the semiconductor layer masked by the first conductive layer, respectively, and regions of the semiconductor layer not masked by the first conductive layer each become a conductor. That is, both a first region and a second region of each of the first to seventh active layers each become a conductor.

Figures 9A, 9B:
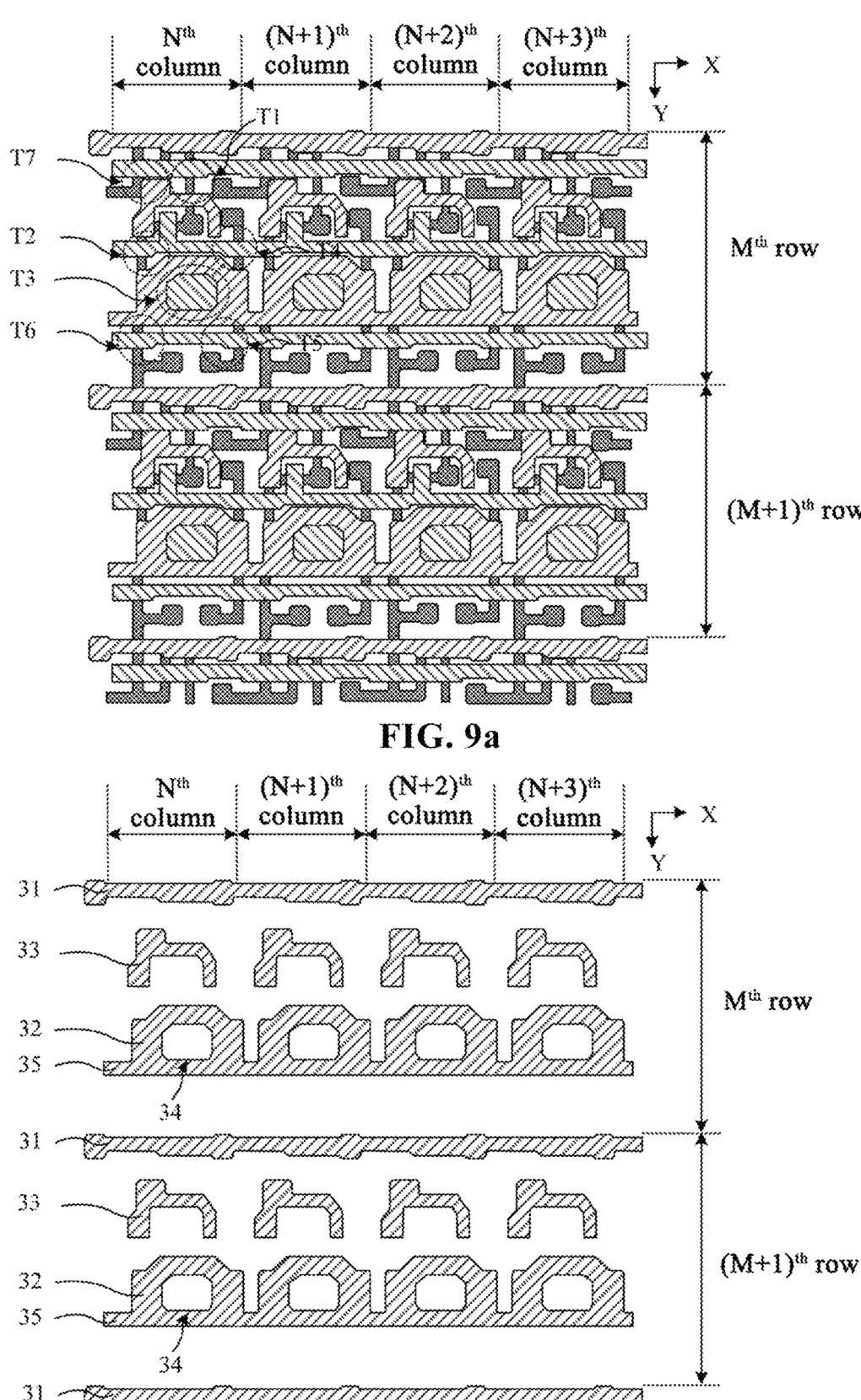

(3) Forming a pattern of a second conductive layer. In an exemplary embodiment, the forming a pattern of the second conductive layer may include: sequentially depositing a third insulating film and a second conductive film on the base substrate with the above described patterns formed thereon, and patterning the second conductive film through a patterning process, to form a third insulating layer covering the first conductive layer and the pattern of the second conductive layer arranged on the third insulating layer. The pattern of the second conductive layer includes, as shown in FIGS. 9a and 9b, at least the first initial signal line 31, a second plate 32, a shielding electrode 33 and a plate connection line 35. FIG. 9b is a schematic plan view of the second conductive layer in FIG. 9a. In an exemplary embodiment, the second conductive layer may be referred to as a second gate metal (GATE2) layer.

In conjunction with FIGS. 7 to 9b, a main portion of the first initial signal line 31 may extend in the first direction X. The first initial signal line 31 of a circuit unit in the $M^{th}$ row is located on a side of the second scanning signal line 22 of this circuit unit away from a circuit unit in the $(M+1)^{th}$ row. The second plate 32, as the other plate of the storage capacitor, is located between the first scanning signal line 21 and the light emitting control line 23 of this circuit unit. The shielding electrode 33 is located between the second scanning signal line 22 and the first scanning signal line 21 (not including the main portion of the gate block 21-1) of this circuit unit. The shielding electrode 33 is configured to shield a key node from being affected by a data voltage jump, so as to avoid an influence of the data voltage jump on a potential of the key node of the pixel driving circuit, and improve the display effect.

In some examples, the second plate 32 may have a rectangular shape, corners of the rectangular shape may be chamfered. An overlapping region exists between an orthographic projection of the second plate 32 on the base substrate and an orthographic projection of the first plate 24 on the base substrate, and the first plate 24 and the second plate 32 form the storage capacitor of the pixel driving circuit. The second plate 32 has an opening 34, and the opening 34 may be located in the middle of the second plate 32. The opening 34 may be rectangular such that the second plate 32 forms a ring-shaped structure. The opening 34 exposes the third insulating layer covering the first plate 24, and the orthographic projection of the first plate 24 on the base substrate includes the orthographic projection of the opening 34 on the base substrate. In an exemplary embodiment, the opening 34 is configured to receive a subsequently formed first via, which is located within the opening 34 and exposes the first plate 24, to connect a subsequently formed second electrode of the first transistor T1 to the first plate 24.

In an exemplary embodiment, the plate connection line 35 is arranged between the second plates 32 of adjacent circuit units in the first direction X or in a direction opposite to the first direction X. A first end of the plate connection line 35 is connected to the second plate 32 of the circuit unit, and a second end of the plate connection line 35 extends in the first direction X or in the direction opposite to the first direction X and is connected to the second plate 32 of the adjacent circuit unit. That is, the plate connection line 35 is configured to connect the second plates of the adjacent circuit units in a unit row to each other. In an exemplary embodiment, the second plates of the plurality of circuit units in a unit row may form an inter-connected one-piece structure through the plate connection line 35, and the second plates of the one-piece structure may also serve as a power signal line, so as to ensure that the plurality of second plates in a unit row have a same potential, which is beneficial to improving the uniformity of the display panel, avoiding the display defects of the display substrate from occurring, and ensuring a good display effect of the display substrate.

Figures 10A, 10B:
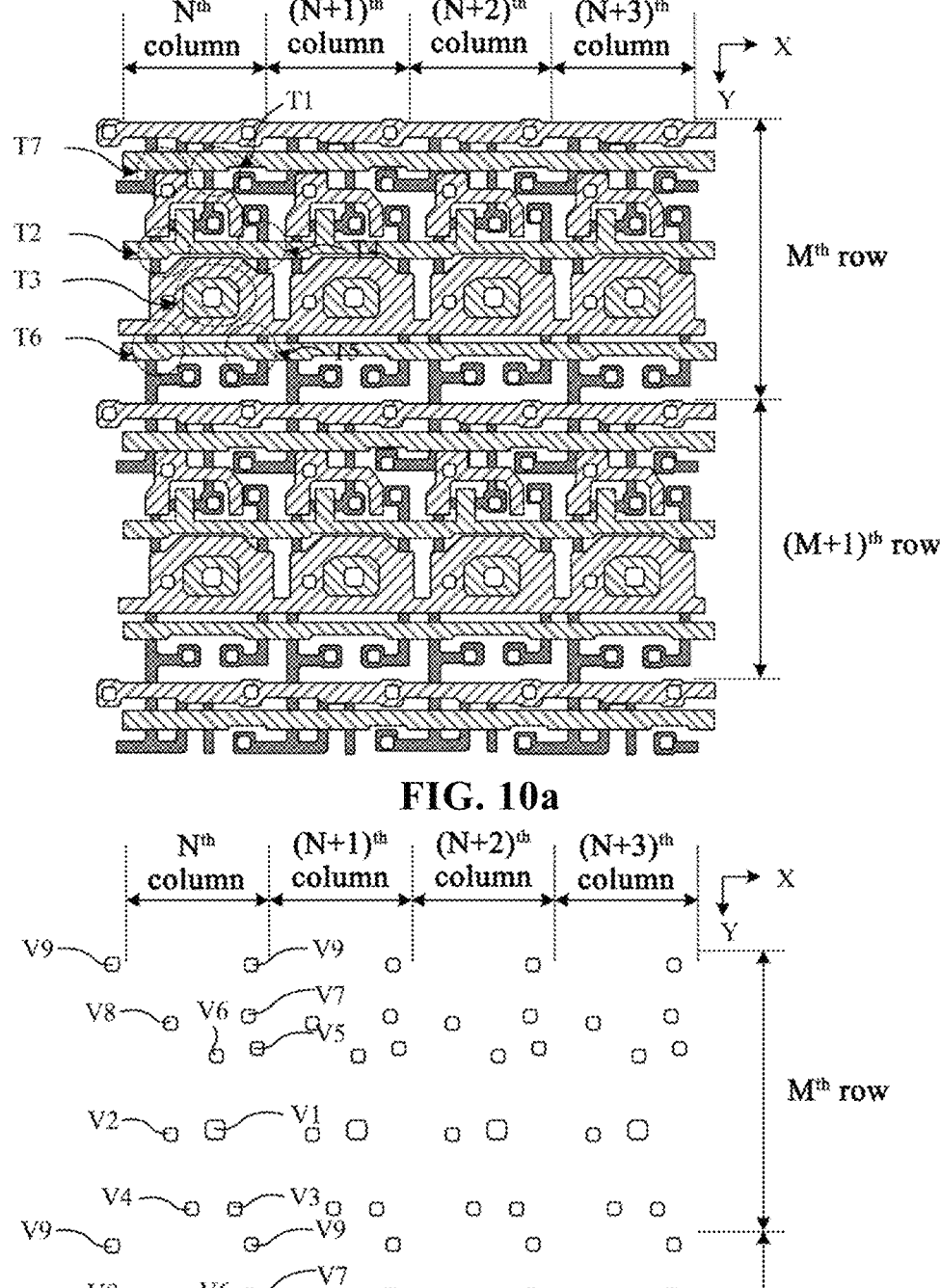

(4) Forming a pattern of a fourth insulation layer. In an exemplary embodiment, the forming a pattern of a fourth insulation layer may include: depositing a fourth insulating film on the base substrate with the above described patterns formed thereon, and patterning the fourth insulating film through a patterning process, to form the fourth insulating layer covering the second conductive layer. Each circuit unit is provided with a plurality of vias, and the plurality of vias include, as shown in FIGS. 10*a* and 10*b*, at least a first via V1, a second via V2, a third via V3, a fourth via V4, a fifth via V5, a sixth via V6, a seventh via V7, an eighth via V8, and a ninth via V9. FIG. 10*b* is a schematic plan view of the plurality of vias in FIG. 10*a*.

In conjunction with FIGS. 7 to 10*b*, the first via V1 is located in the opening 34 of the second plate 32, and an orthographic projection of the first via V1 on the base substrate is within the orthographic projection of the opening 34 on the base substrate. Parts of the fourth insulating layer and the third insulating layer in the first via V1 are etched away, exposing a surface of the first plate 24.

The first via V1 is configured to connect the subsequently formed second electrode of the first transistor T1 to the first plate 24 through this via.

In some examples, an orthographic projection of the second via V2 on the base substrate is within the orthographic projection of the second plate 32 on the base substrate. A part of the fourth insulating layer in the second via V2 is etched away, exposing a surface of the second plate 32. The second via V2 is configured to connect a subsequently formed first power supply line to the second plate 32 through this via. In some examples, a plurality of second vias V2 as power vias may be provided, and the plurality of second vias V2 may be sequentially arranged along a second direction Y, to increase the connection reliability between the first power supply line and the second plate 32.

In some examples, an orthographic projection of the third via V3 on the base substrate is within an orthographic projection of the fifth active layer on the base substrate, and parts of the fourth insulating layer, the third insulating layer and the second insulating layer in the third via V3 are etched away, exposing a surface of a first region of the fifth active layer. The third via V3 is configured to connect a subsequently formed first power supply line to the fifth active layer through this via.

In some examples, an orthographic projection of the fourth via V4 on the base substrate is within an orthographic projection of the sixth active layer on the base substrate, and parts of the fourth insulating layer, the third insulating layer and the second insulating layer in the fourth via V4 are etched away, exposing a surface of a second region of the sixth active layer (also a second region of the seventh active layer). The fourth via V4 is configured to connect a subsequently formed second electrode of the sixth transistor T6 to the sixth active layer through this via, and to connect a subsequently formed second electrode of the seventh transistor T7 to the seventh active layer through this via.

In some examples, an orthographic projection of the fifth via V5 on the base substrate is within an orthographic projection of the fourth active layer on the base substrate, and parts of the fourth insulating layer, the third insulating layer and the second insulating layer in the fifth via V5 are etched away, exposing a surface of a first region of the fourth active layer. The fifth via V5 is configured to connect a subsequently formed data signal line to the fourth active layer through this via, and the fifth via V5 is referred to as a data writing hole.

In some examples, an orthographic projection of the sixth via V6 on the base substrate is within an orthographic projection of the second active layer on the base substrate, and parts of the fourth insulating layer, the third insulating layer and the second insulating layer in the sixth via V6 are etched away, exposing a surface of a first region of the second active layer (also a second region of the first active layer). The sixth via V6 is configured to connect the subsequently formed second electrode of the first transistor T1 to the first active layer through this via, and to connect the subsequently formed first electrode of the second transistor T2 to the second active layer through this via.

In some examples, an orthographic projection of the seventh via V7 on the base substrate is within an orthographic projection of the seventh active layer on the base substrate, and parts of the fourth insulating layer, the third insulating layer and the second insulating layer in the seventh via V7 are etched away, exposing a surface of a first region of the seventh active layer (also a first region of the first active layer). The seventh via V7 is configured to connect a subsequently formed first electrode of the seventh transistor T7 to the seventh active layer through this via, and to connect the subsequently formed first electrode of the first transistor T1 to the first active layer through this via.

In some examples, an orthographic projection of the eighth via V8 on the base substrate is within an orthographic projection of the shielding electrode 33 on the base substrate, and a part of the fourth insulating layer in the eighth via V8 is etched away, exposing a surface of the shielding electrode 33. The eighth via V8 is configured to connect the subsequently formed first power supply line with the shielding electrode 33 through this via.

In some examples, an orthographic projection of the ninth via V9 on the base substrate is within an orthographic projection of the first initial signal line 31 on the base substrate, and a part of the fourth insulating layer in the ninth via V9 is etched away, exposing a surface of the first initial signal line 31. The ninth via V9 is configured to connect a subsequently formed first electrode of the seventh transistor T7 (also a first electrode of the first transistor T1) to the first initial signal line 31 through this via.

Figure 11A:
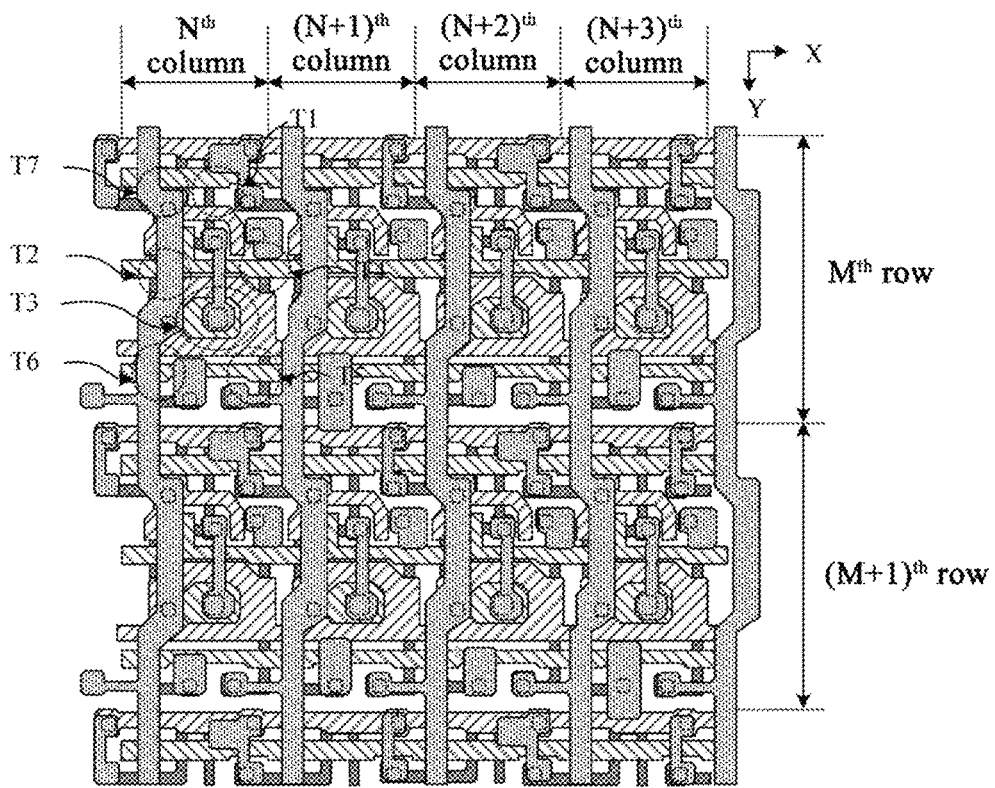
FIG. 11a is a schematic diagram illustrating formation of a pattern of a third conductive layer for a display substrate according to the present disclosure.
Figure 11B:
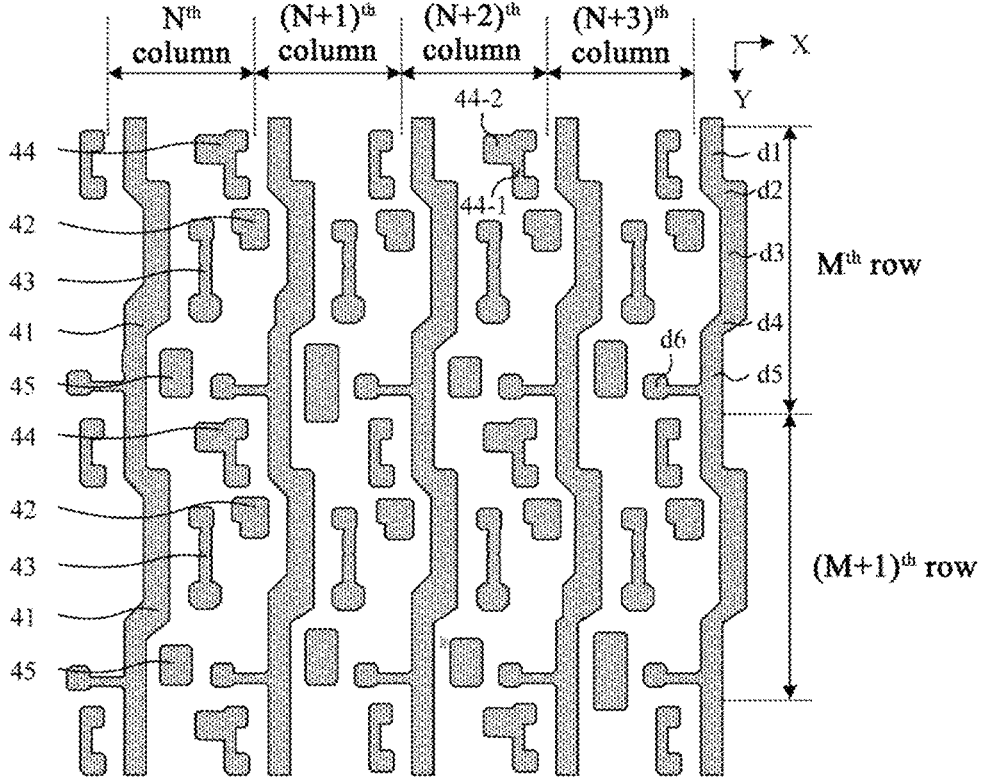

(5) forming a pattern of a third conductive layer. In some examples, the forming a pattern of a third conductive layer may include: depositing a third conductive film on the base substrate with the above described patterns formed thereon, and patterning the third conductive film through a patterning process, to form a third conductive layer arranged on the fourth insulating layer. The third conductive layer includes, as shown in FIGS. 11a and 11b, at least a first power supply line 41, a data connection electrode 42, a first connection electrode 43, a second connection electrode 44, and a third connection electrode 45. FIG. 11b is a schematic plan view of the third conductive layer in FIG. 11a. In some examples, the third conductive layer may be referred to as a first source/drain metal (SD1) layer.

In conjunction with FIGS. 7 to 11b, a main portion of the first power supply line 41 extends in the second direction Y. The first power supply line 41 is connected to the second plate 32 through the second via V2 on the one hand, and is connected to the fifth active layer through the third via V3 on the other hand, and further is connected to the shielding electrode 33 through the eighth via V8, so that the shielding electrode 33 and the second plate 32 have the same potential as the first power supply line 41. Since the shielding electrode 33 is connected to the first power supply line 41, and an orthographic projection of at least a part (e.g. a protrusion at the right side of the shielding electrode 33) of the shielding electrode 33 on the base substrate is located between an orthographic projection of the first connection electrode 43 (serving as the second electrode of the first transistor T1 and the first electrode of the second transistor T2, i.e. the second node N2) on the base substrate and an orthographic projection of a subsequently formed data signal line on the base substrate, the influence of the data voltage jump on the key node in the pixel driving circuit may be effectively shielded, the influence of the data voltage jump on the potential of the key node of the pixel driving circuit is avoided, and the display effect is improved.

In some examples, an orthographic projection of the at least a part of the shielding electrode 33 on the base substrate may at least partially overlap an orthographic projection of the subsequently formed data signal line on the base substrate. In an exemplary embodiment, the shielding electrodes 33 in the circuit units adjacent to each other in the first direction X may be connected to each other to reduce resistance.

In some examples, the data connection electrode 42 is connected to the first region of the fourth active layer through the fifth via V5, and the data connection electrode 42 is configured to be connected to the subsequently formed data signal line.

In some examples, the first connection electrode 43 extends in the second direction Y, a first end of the first connection electrode 43 is connected to the second region of the first active layer (also the first region of the second active layer) through the sixth via V6, and a second end of the first connection electrode 43 is connected to the first plate 24 through the first via V1, so that the first plate 24, the second electrode of the first transistor T1, and the first electrode of the second transistor T2 have the same potential. In an exemplary embodiment, the first connection electrode 43 may serve as the second electrode of the first transistor T1 and the first electrode of the second transistor T2.

In some examples, a first end of the second connection electrode 44 is connected to the first initial signal line 31 through the ninth via V9, and a second end of the second connection electrode 44 is connected to the first region of the seventh active layer (also the first region of the first active layer) through the seventh via V7, so that the first electrodes of the seventh transistor T7 and the first electrode of the first transistor T1 have the same potential as the first initial signal line 31. In an exemplary embodiment, the second connection electrode 44 may serve as a first electrode of the seventh transistor T7 and a first electrode of the first transistor T1, and the second connection electrode is configured to be connected to a subsequently formed second initial signal line. In the present disclosure, by arranging the second connection electrode in concurrent connection with the seventh active layer, the first initial signal line and the second initial signal line, the number of vias and the number of transition electrodes can be reduced, and the wiring space can be saved.

In some examples, the third connection electrode 45 is connected to the second region of the sixth active layer (also the second region of the seventh active layer) through the fourth via V4, so that the second electrode of the sixth transistor T6 and the second electrode of the seventh transistor T7 have the same potential. In an exemplary embodiment, the third connection electrode 45 may serve as the second electrode of the sixth transistor T6 and the second electrode of the seventh transistor T7. In an examplary embodiment, the third connection electrode 45 is configured to be connected to a subsequently formed anode connection electrode.

In some examples, the first power supply line 41 in at least one circuit unit may be a polygonal line of unequal width. Along the second direction Y, the first power supply line 41 in each circuit unit may include a first power supply section d1, a second power supply section d2, a third power supply section d3, a fourth power supply section d4 and a fifth power supply section d5 which are sequentially connected together. The first power supply section d1, the third power supply section d3 and the fifth power supply section d5 may be parallel to the second direction Y, the second power supply section d2 may be bent toward the first direction X, and the fourth power supply section d4 may be bent toward a direction opposite to the first direction X. An included angle between the second power supply section d2 and the first power supply section d1 may be greater than 0° and less than 90°, and an included angle between the fourth power supply section d4 and the third power supply section d3 may be greater than 0° and less than 90°. The fifth power supply section d5 is provided with a connection part d6 extending in the direction opposite to the first direction X, and the connection part d6 is configured to be connected to the fifth active layer through a third via. The first power supply line 41 is arranged as a polygonal line, which not only facilitates the layout of the pixel structure, but also reduces a parasitic capacitance between the first power supply line and the data signal line.

In some examples, the shapes of the first power supply lines of the respective circuit units may be the same, or may be different. In an exemplary embodiment, a shape of the first power supply line in the circuit unit in $M^{th}$ row and $N^{th}$ column and a shape of the first power supply line in the circuit unit in $(M+1)^{th}$ row and $(N+2)^{th}$ column may be the same; a shape of the first power supply line in the circuit unit in $(M+1)^{th}$ row and $N^{th}$ column and a shape of the first power supply line in the circuit unit in $M^{th}$ row and $(N+2)^{th}$ column may be the same; a shape of the first power supply line in the circuit unit in $M^{th}$ row and $(N+1)^{th}$ column and a shape of the first power supply line in the circuit unit in $(M+1)^{th}$ row and $(N+3)^{th}$ column may be the same; and a shape of the first power supply line in the circuit unit in $(M+1)^{th}$ row and $(N+1)^{th}$ column and a shape of the first power supply line in the circuit unit in $M^{th}$ row and $(N+3)^{th}$ column may be the same.

In some examples, a shape of the second connection electrode in each circuit unit in the $N^{th}$ column and a shape of the second connection electrode in each circuit unit of the $(N+2)^{th}$ column may be the same, and a shape of the second connection electrode in each circuit unit in the $(N+1)^{th}$ column and a shape of the second connection electrode in each circuit unit in the $(N+3)^{th}$ column may be the same. The second connection electrodes in the circuit units in $(N+1)^{th}$ and $(N+3)^{th}$ columns may have a strip shape extending along the second direction Y, and each of the second connection electrode is configured to be connected to the first initial signal line and the first region of the seventh active layer through a ninth via and a seventh via, respectively. The shape of each of the second connection electrodes 44 in the circuit units in $N^{th}$ and $(N+2)^{th}$ columns may include a first part 44-1 and a second part 44-2 connected to each other. The first part 44-1 has a strip shape extending along the second direction Y, the second part 44-2 has a rectangular shape, and the second part 44-2 is arranged on a side of the first part 44-1 opposite to the first direction X. The first part 44-1 is configured to be connected to the first initial signal line and the first region of the seventh active layer through a ninth via and a seventh via, respectively. The second part 44-2 is configured to be connected to the subsequently formed second initial signal line through a subsequently formed via, thereby realizing connection between the first initial signal line and the second initial signal line.

In some examples, the shapes of the third connection electrodes in the respective circuit units may be the same, or may be different. In an exemplary embodiment, a shape of the third connection electrode in the circuit unit in $M^{th}$ row and $N^{th}$ column and a shape of the third connection electrode in the circuit unit in $(M+1)^{th}$ row and $(N+2)^{th}$ column may be the same; a shape of the third connection electrode in the circuit unit in $(M+1)^{th}$ row and $N^{th}$ column and a shape of the third connection electrode in the circuit unit in $M^{th}$ row and $(N+2)^{th}$ column may be the same; a shape of the third connection electrode in the circuit unit in $M^{th}$ row and $(N+1)^{th}$ column and a shape of the third connection electrode in the circuit unit in $(M+1)^{th}$ row and $(N+3)^{th}$ column may be the same; and a shape of the third connection electrode in the circuit unit in $(M+1)^{th}$ row and $(N+1)^{th}$ column and a shape of the third connection electrode in the circuit unit in $M^{th}$ row and $(N+3)^{th}$ column may be the same.

In an exemplary embodiment, the shapes of the data connection electrode and the first connection electrode in the respective circuit units may be the same, or may be different.

Figure 12A:
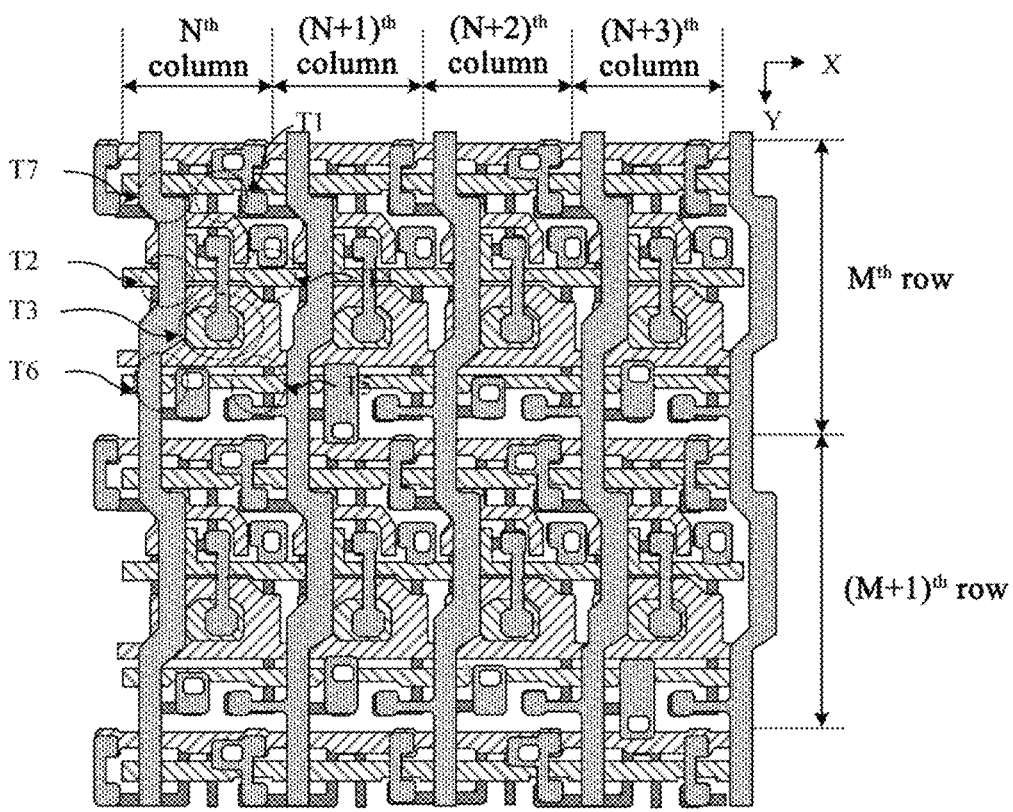
FIG. 12a is a schematic diagram illustrating formation of a pattern of a first planarization layer for a display substrate according to the present disclosure.
Figure 12B:
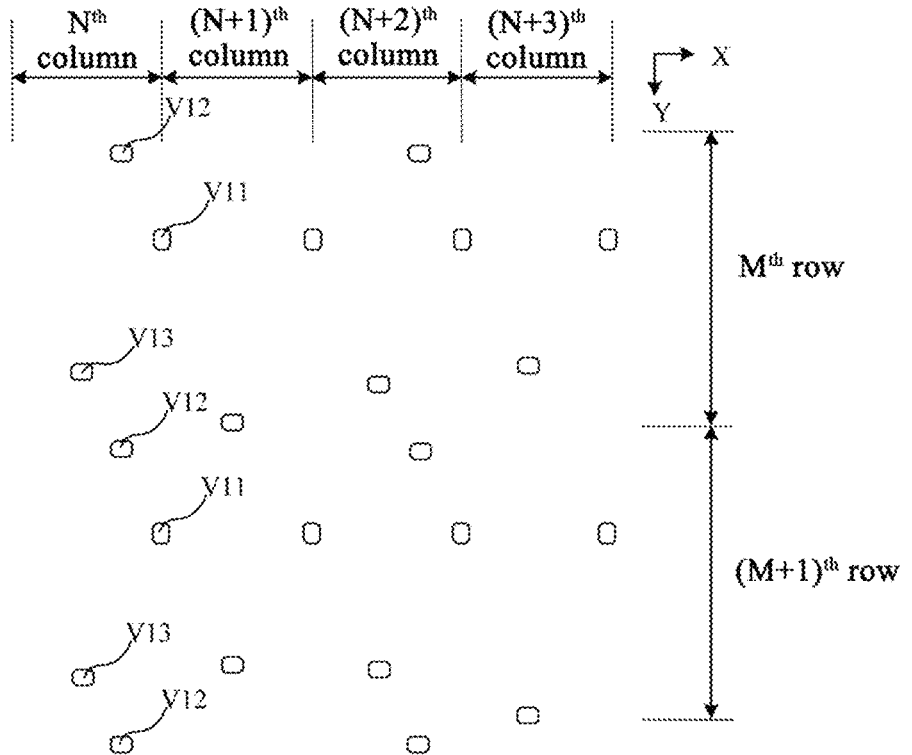

(6) Forming a pattern of a first planarization layer. In an exemplary embodiment, the forming a pattern of a first planarization layer may include: coating a first planarization film on the base substrate with the above described patterns formed thereon, and patterning the first planarization film by a patterning process, to form the first planarization layer covering the third conductive layer. As shown in FIGS. 12a and 12b, an eleventh via V11, a twelfth via V12, and a thirteenth via V13 are arranged in the first planarization layer. FIG. 12b is a schematic plan view of a plurality of vias in FIG. 12a.

In conjunction with FIGS. 7 to 12b, an orthographic projection of the eleventh via V11 on the base substrate is within an orthographic projection of the data connection electrode 42 on the base substrate, and a part of the first planarization layer in the eleventh via V11 is removed, exposing a surface of the data connection electrode 42. The eleventh via V11 is configured to connect a subsequently formed data signal line to the data connection electrode 42 through this via.

In some examples, the eleventh via V11 may be in a strip shape, and an extension length of the eleventh via V11 in the second direction Y is greater than an extension length thereof in the first direction X. According to the present disclosure, by providing the eleventh via V11 in the strip shape extending in the second direction Y, a width of the eleventh via V11 in the first direction X may be reduced, and an inclination degree of a subsequently formed anode may be reduced.

An orthographic projection of the twelfth via V12 on the base substrate is within an orthographic projection of the second connection electrode 44 on the base substrate, and a part of the first planarization layer in the twelfth via V12 is removed, exposing a surface of the second connection electrode 44. The twelfth via V12 is configured to connect the subsequently formed second initial signal line to the second connection electrode 44 through this via.

An orthographic projection of the thirteenth via V13 on the base substrate is within an orthographic projection of the third connection electrode 45 on the base substrate, and a part of the first planarization layer in the thirteenth via V13 is removed, exposing a surface of the third connection electrode 45. The thirteenth via V13 is configured to connect the subsequently formed anode connection electrode to the third connection electrode 45 through this via.

In some examples, all the circuit units are provided with the eleventh via V11 and the thirteenth via V13, each of the circuit units in the $N^{th}$ and $(N+2)^{th}$ columns is provided with the twelfth via V12, and each of the circuit units in the $(N+1)^{th}$ and $(N+3)^{th}$ columns is not provided with the twelfth via V12.

In an exemplary embodiment, the positions of the eleventh via V11 and the thirteenth via V13 in the respective circuit units may be the same, or may be different.

Figures 13A, 13B:
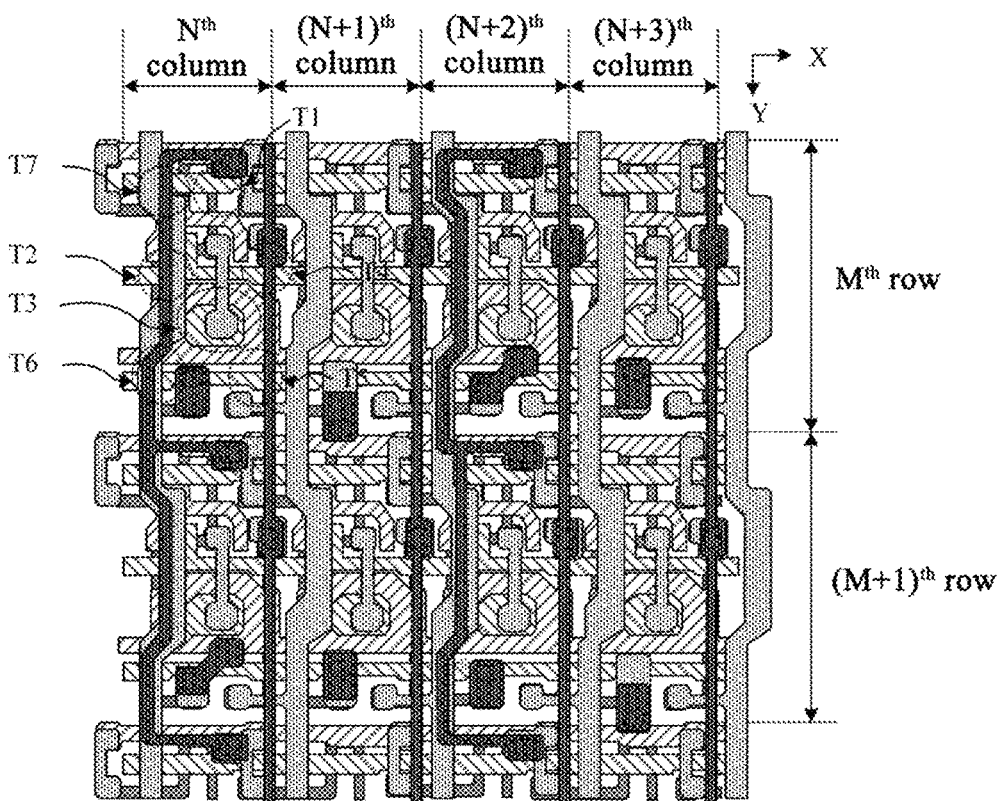

(7) Forming a pattern of a fourth conductive layer. In an exemplary embodiment, the forming a pattern of a fourth conductive layer may include: depositing a fourth conductive film on the base substrate with the above described patterns formed thereon, and patterning the fourth conductive film through a patterning process, to form the fourth conductive layer arranged on the first planarization layer. The fourth conductive layer includes, as shown in FIGS. 13a and 13b, at least a data signal line 51, a second initial signal line 2, and an anode connection electrode 53. FIG. 13b is a schematic plan view of the fourth conductive layer in FIG. 13a.

In conjunction with FIGS. 8 to 13*b*, the data signal line 51 is provided in each unit column. The data signal line 51 may extend in the second direction Y, and the data signal line 51 is connected to the data connection electrode 42 through the eleventh via V11. Since the data connection electrode 42 is connected to the first region of the fourth active layer through the fifth via V5, it is achieved that the data signal line 51 is connected to the first region of the fourth active layer through the data connection electrode 42, to write the data signal into the fourth transistor T4.

In an exemplary embodiment, the second initial signal lines 52 are arranged in the Nth unit column and the (N+2)th unit column, and the second initial signal lines 52 in all the circuit units in the unit columns are connected to each other. A main portion of the second initial signal line 52 extends in the second direction Y, and the second initial signal line 52 is connected to the second connection electrode 44 through the twelfth via V12. Since the second connection electrode 44 is connected to the first initial signal line 31 through the ninth via V9, it is realized that the second initial signal line 52 is connected to the first initial signal line 31 through the second connection electrode 44, so that the first initial signal line 31 and the second initial signal line 52 have the same potential. In the present disclosure, by arranging the first initial signal line 31 with the main portion extending along first direction X and the second initial signal line 52 with the main portion extending along second direction Y, the initial signal lines form a network structure, which not only effectively reduces a resistance of the initial signal lines and a drop of the initial voltage, but also effectively improves uniformity of the initial voltage in the display substrate, the display uniformity, thereby the display performance and display quality.

In some examples, the anode connection electrode 53 is provided in at least a part of the circuit units. The anode connection electrode 53 is connected to the third connection electrode 45 through the thirteenth via V13. Since the third connection electrode 45 is connected to the second region of the sixth active layer (also the second region of the seventh active layer) through the fourth via V4, it is achieved that the anode connection electrode 53 is connected to the second region of the sixth active layer (also the second region of the seventh active layer) through the third connection electrode 45.

In some examples, the second initial signal line 52 in one circuit unit may include an extension part 521 and a connection part 522. The extension part 521 may be a polygonal line, which has a main portion extending along the second direction Y, and the connection part 522 may be a straight line, which has a main portion extending along the first direction X. In an exemplary embodiment, an end of the connection part 522 away from the extension part 521 may be connected to the second connection electrode 44 through the twelfth via V12.

In some examples, an orthographic projection of at least a part of the extension part 521 on the base substrate is within an orthographic projection of the first power supply line 41 on the base substrate, so that the first power supply line 41 can effectively shield the influence of the second initial signal line 52 on the key node in the pixel driving circuit, the potential at the key node of the pixel driving circuit can be prevented from being affected by the initial signal, the layout space can be fully utilized, the light transmittance can be prevented from being affected by the arrangement of the second initial signal line, and the display effect is improved.

In some examples, an orthographic projection of at least a part of the connection part 522 on the base substrate is within an orthographic projection of the first initial signal line 31 on the base substrate, so that the layout space can be fully utilized, the light transmittance is prevented from being affected by the arrangement of the second initial signal line, and the display effect is improved.

In some examples, a shape of the second initial signal line 52 in the circuit unit in $M^{th}$ row and $N^{th}$ column and a shape of the second initial signal line 52 in the circuit unit in $(M+1)^{th}$ row and $(N+2)^{th}$ column may be the same; and a shape of the second initial signal line 52 in the circuit unit in $(M+1)^{th}$ row and $N^{th}$ column and a shape of the second initial signal line 52 in the circuit unit in $M^{th}$ row and $(N+2)^{th}$ column may be the same.

In some examples, in the circuit unit in $M^{th}$ row and $N^{th}$ column and the circuit unit in $(M+1)^{th}$ row and $(N+2)^{th}$ column, the extension part 521 may include a first initial section c1, a second initial section c2, and a third initial section c3, which are sequentially connected together along the second direction Y. The first initial section c1 and the third initial section c3 may be parallel to the second direction Y, the second initial section c2 may be deflected toward a direction opposite to the first direction X, a first included angle θ1 exists between the second initial section c2 and the second direction Y, and the first included angle θ1 may be greater than 0° and less than 90°.

In some examples, in the circuit unit in $M^{th}$ row and $(N+2)^{th}$ column and the circuit unit in $(M+1)^{th}$ row and $N^{th}$ column, the extension part 521 may include a fourth initial section c4, a fifth initial section c5, a sixth initial section c6, a seventh initial section c7, and an eighth initial section c8 sequentially connected together along the second direction Y. The fourth initial section c4, the sixth initial section c6, and the eighth initial section c8 may be parallel to the second direction Y, a second included angle θ2 may exist between the fifth initial section c5 and the second direction Y, a third included angle θ3 may exist between the seventh initial section c7 and the second direction Y, the second included angle θ2 may be greater than 0° and less than 90°, and the third included angle θ3 may be greater than 0° and less than 90°.

In some examples, the extending direction of the fifth initial section c5 and the extending direction of the seventh initial section c7 may be substantially mirror-symmetrical to each other with respect to the first direction X.

In some examples, at least a part of the circuit units are provided with the data signal line 51 and the anode connection electrode 53, each of the circuit units in the $N^{th}$ column and the $(N+2)^{th}$ column is provided with the second initial signal line 52, and each of the circuit units in the $(N+1)^{th}$ column and the $(N+3)^{th}$ column is not provided with the second initial signal line 52.

In some examples, a shape of the anode connection electrode in the circuit unit in $M^{th}$ row and $N^{th}$ column and a shape of the anode connection electrode in the circuit unit in $(M+1)^{th}$ row and $(N+2)^{th}$ column may be the same, and the shape of the anode connection electrode may be rectangular. A shape of the anode connection electrode in the circuit unit in $(M+1)^{th}$ row and $N^{th}$ column and a shape of the anode connection electrode in the circuit unit in $M^{th}$ row and $(N+2)^{th}$ column may be the same, and the anode connection electrode may be dumbbell-shaped. A shape of the anode connection electrode in the circuit unit in $M^{th}$ row and $(N+1)^{th}$ column and a shape of the anode connection electrode in the circuit unit in $(M+1)^{th}$ row and $(N+3)^{th}$ column may be the same, and the shape of the anode connection electrode may be rectangular. A shape of the anode connection electrode in the circuit unit in $(M+1)^{th}$ row and $(N+1)^{th}$ column and a shape of the anode connection electrode in the circuit unit in $M^{th}$ row and $(N+3)^{th}$ column may be the same, and the shape of the anode connection electrode may be rectangular.

Figures 14A, 14B:
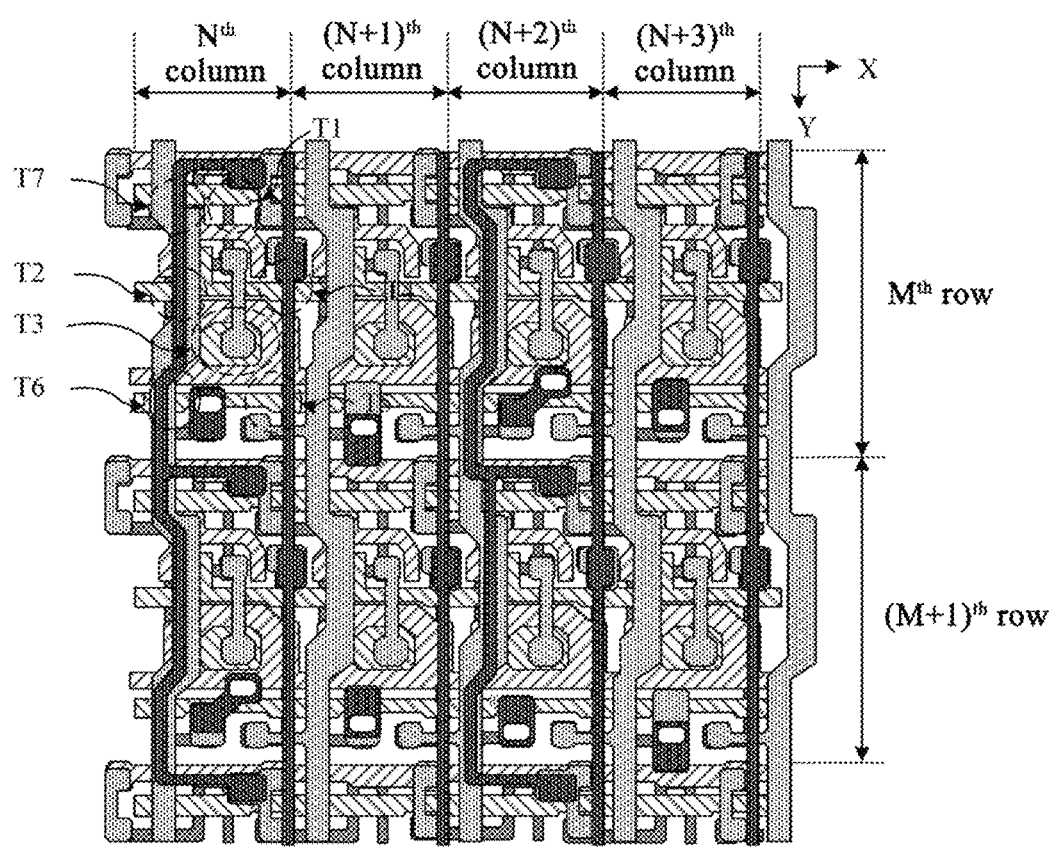

(8) Forming a pattern of a second planarization layer. In an exemplary embodiment, the forming a pattern of a second planarization layer may include: coating a second planarization film on the base substrate with the above described patterns formed thereon, and patterning the second planarization film through a patterning process, to form the second planarization layer covering the fourth conductive layer. As shown in FIGS. 14a and 14b, a fourteenth via V14 is formed in the second planarization layer. FIG. 14b is a schematic plan view of a plurality of vias in FIG. 14a.

In conjunction with FIGS. 7 to 14b, an orthographic projection of the fourteenth via V14 on the base substrate is within an orthographic projection of the anode connection electrode 53 on the base substrate, and a part of the second planarization layer in the fourteenth via V14 is removed, exposing a surface of the anode connection electrode 53. The fourteenth via V14 is configured to connect a subsequently formed anode to the anode connection electrode 53 through this via.

To this end, the driving circuit layer is formed on the base substrate. The driving circuit layer may include a plurality of circuit units in a plane parallel to the display substrate, and each of the plurality of circuit units may include a pixel driving circuit, and a first scanning signal line, a second scanning signal line, a light emitting control line, a data signal line, a first power supply line, a first initial signal line, and a second initial signal line, which are connected to the pixel driving circuit. The driving circuit layer may include, in a plane perpendicular to the display substrate, a first insulating layer, a semiconductor layer, a second insulating layer, a first conductive layer, a third insulating layer, a second conductive layer, a fourth insulating layer, a third conductive layer, a first planarization layer, a fourth conductive layer, and a second planarization layer, which are sequentially stacked on the base substrate.

In some examples, after the driving circuit layer is formed, a light emitting structure layer is formed on the driving circuit layer. Forming the light emitting structure layer means that a light emitting device in the light emitting structure layer is formed on a side of the driving circuit layer away from the base substrate. The manufacturing process of the light emitting device may adopt any method in the prior art, and thus, the details are not repeated herein.

In some examples, the base substrate may be a flexible base substrate, or may be a rigid base substrate. The rigid base substrate may be, but is not limited to, one or more of glass, quartz, and the flexible base substrate may be, but is not limited to, one or more of polyethylene terephthalate, ethylene terephthalate, polyetheretherketone, polystyrene, polycarbonate, polyarylate, polyimide, polyvinyl chloride, polyethylene, and textile fiber.

In an exemplary embodiment, the flexible base substrate may include a first flexible material layer, a first inorganic material layer, a semiconductor layer, a second flexible material layer, and a second inorganic material layer, which are stacked together. The first flexible material layer and the second flexible material layer may be made of Polyimide (PI), polyethylene terephthalate (PET), or a surface-treated polymer film. The first inorganic material layer and the second inorganic material layer may be made of silicon nitride (SiNx), silicon oxide (SiOx), or the like, for improving water-oxygen resistance of the base substrate. The semiconductor layer may be made of amorphous silicon (a-si).

In some examples, the first, second, third, and fourth conductive layers may each be made of a metal material, such as any one or more of silver (Ag), copper (Cu), aluminum (Al), and molybdenum (Mo), or an alloy material of the above metals, such as aluminum neodymium alloy (AlNd) or molybdenum niobium alloy (MoNb), and may each have a single-layer structure or a multi-layer composite structure, such as Mo/Cu/Mo, or the like. The first, second, third, and fourth insulating layers may each be made of any one or more of silicon oxide (SiOx), silicon nitride (SiNx), and silicon oxynitride (SiON), and may each be of a single layer, a multilayer, or a composite layer.

The first insulating layer is referred to as a buffer layer for improving water-oxygen resistance of the base substrate. The second and third insulating layers each are referred to as a gate insulating (GI) layer, and the fourth insulating layer is referred to as an interlayer insulating (ILD) layer. The active layer may be made of amorphous indium gallium zinc oxide (a-IGZO), zinc oxynitride (ZnON), Indium Zinc Tin oxide (IZTO), amorphous silicon (a-Si), poly-silicon (p-Si), hexathiophene, polythiophene, or the like. That is, the present disclosure is applicable to a transistor manufactured based on an oxide technology, a silicon technology, or an organic technology. The first and second planarization layers may be made of an organic material such as resin or the like.

In addition, the light emitting structure layer in the embodiment of the present disclosure may include an anode layer, a pixel defining layer, an emission layer, a cathode layer, an encapsulation layer, and the like, which are sequentially arranged on the second planarization layer, to form a plurality of light emitting devices in the light emitting structure layer. The process of forming the light emitting structure layer may adopt conventional processes, and thus, the details are not repeated herein.

It can be seen from the structure and the manufacturing process of the display substrate described above that, in the display substrate provided by the embodiment of the present disclosure, by arranging the first initial signal line with the main portion extending along the first direction and the second initial signal line with the main portion extending along the second direction, the initial signal lines form a network structure, which not only effectively reduces a resistance of the initial signal lines and a drop of the initial voltage, but also effectively improves uniformity of the initial voltage in the display substrate, the display uniformity, thereby the display performance and display quality. According to the embodiment of the present disclosure, the first initial signal line and the second initial signal line are arranged in different conductive layers, the extension part of the second initial signal line at least partially overlaps the first power supply line, and the connection part of the second initial signal line at least partially overlaps the first initial signal line, so that the first power supply line can effectively shield the influence of the second initial signal line 52 on the key node in the pixel driving circuit, the potential at the key node of the pixel driving circuit can be prevented from being affected by the initial signal, the layout space can be fully utilized, and the light transmittance can be prevented from being affected by the arrangement of the second initial signal line.

Figure 15:
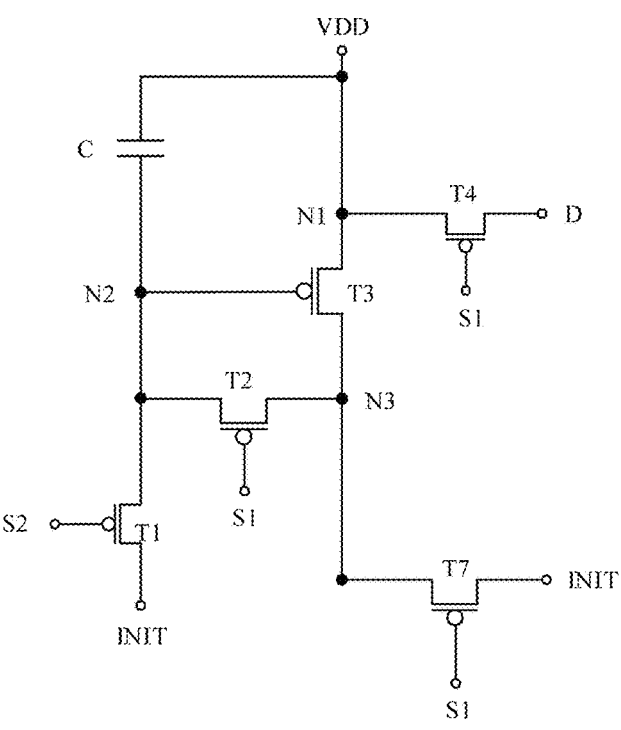
FIG. 15 is a schematic diagram illustrating an equivalent circuit of a second pixel driving circuit of another display substrate according to the present disclosure.
Figure 16:
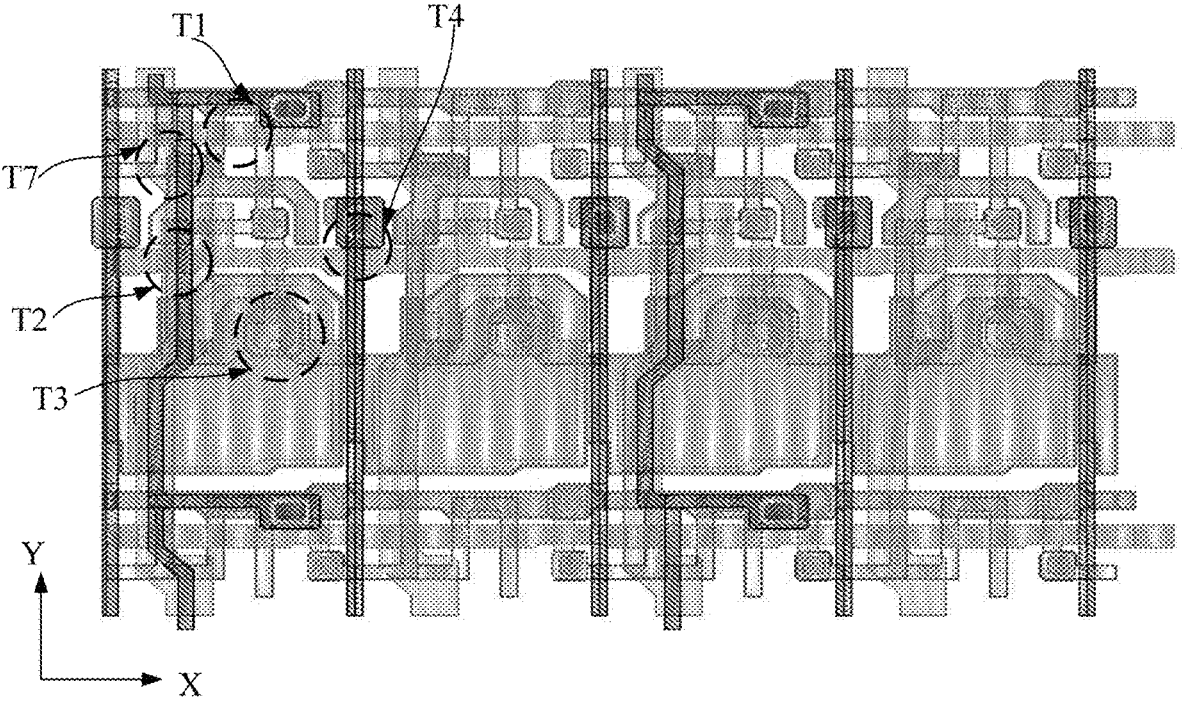
FIG. 16 is a schematic diagram of a structure of another display substrate according to the present disclosure.

FIG. 15 is a schematic diagram illustrating an equivalent circuit of a second pixel driving circuit of another display substrate according to the present disclosure; FIG. 16 is a schematic diagram of a structure of another display substrate according to the present disclosure. As shown in FIGS. 15 and 16, an embodiment of the present disclosure further provides a display substrate, in which a dummy pixel region 02 includes at least one pixel missing region 021 and a redundant region 022 arranged adjacent to the pixel missing region 021. The pixel driving circuits in the display substrate include a first pixel driving circuit located in the display region 01 and a second pixel driving circuit located in the redundant region 022. The architectures of the first pixel driving circuit and the second pixel driving circuit may be the same or different. For example, the first pixel driving circuit and the second pixel driving circuit both adopt an architecture of 7T1C pixel driving circuit; alternatively, the first pixel driving circuit adopts an architecture of 7T1C pixel driving circuit, and the second pixel driving circuit adopts an architecture of 5T1C pixel driving circuit. Specifically, a capacitance value of the storage capacitor in the first pixel drive circuit is less than that in the second pixel drive circuit.

In the embodiment of the present disclosure, since the capacitance value of the storage capacitor in the second pixel driving circuit in the redundant region 022 is greater than that of the storage capacitor in the first pixel driving circuit in the display region 01, an overlap capacitance between the initial signal line in the unit row where the through-hole region 021 is located and other layers is increased, so that the initial signal is compensated, and therefore it can be effectively alleviate the problem of non-uniform low gray scale display caused by the fact that the voltage drop of the initial signal line in the unit row where the through-hole region 021 is located is less than the voltage drop of the initial signal line of the unit row in the normal display region 01 (without the through-hole region 021).

In some examples, as shown in FIG. 15, the first pixel drive circuit adopts an architecture of 7T1C pixel drive circuit, and the second pixel drive circuit adopts an architecture of 5T1C pixel drive circuit. Since the dummy pixel region 02 does not display, it is no need to provide a light emitting device in the redundant region 022 of the dummy pixel region 02, and thus the fifth and sixth transistors for light emitting control are omitted in the second pixel driving circuit compared with the first pixel driving circuit. In some examples, since the fifth and sixth transistors are omitted in the second pixel driving circuit compared with the first pixel driving circuit, that is, the second pixel driving circuit in the redundant region 022 adopts the 5T1C pixel driving circuit in which the second transistor T2 and the fourth transistor T4 are connected to the second transistor T2 and the fourth transistor T4 in the first pixel driving circuit, respectively, the number of transistors is increased, and thus the gate signal is compensated.

In some examples, a size of the storage capacitor in the second pixel driving circuit may be designed according to a size of the missing pixel region 021, and an overlapping area between the second initial signal line and the capacitor plate can be changed. For example, the size of the pixel missing region is proportional to the overlapping area between the upper and lower plates of the storage capacitor in the second pixel driving circuit. That is, the larger the pixel missing region 021 is, the more greater the overlapping area between the upper and lower plates of the storage capacitor in the second pixel driving circuit is larger than the overlapping area between the upper and lower plates of the storage capacitor in the first pixel driving circuit.

It is to be noted that, since the fifth transistor and the sixth transistor are absent in the second pixel driving circuit, it is no need to be provide a light emitting control line for the circuit unit in the redundant region 022. Correspondingly, the light emitting control line in the circuit unit in each unit row where the dummy pixel region 02 is located extends to only a boundary between the dummy pixel region 02 and the display region 01. That is, the first pixel driving circuits arranged on both sides of the dummy pixel region 02 in each unit row in which the dummy pixel region 02 is located adopt different light emitting control lines to write the light emitting control signal. In addition, since the pixel driving circuit in the display region 01 adopts the first pixel driving circuit of 7T1C, the circuit of which is the same as that in the above-described embodiment, the arrangement of the layers and the arrangement of the structure in the circuit unit in the display region 01 are the same as those described above. Therefore, only the circuit unit in the dummy pixel region 02 will be described in the following. That is, the structures included in the display substrate described below are also referred to as structures in the dummy pixel region 02.

In some examples, the display substrate includes a semiconductor layer, a first conductive layer, a second conductive layer, a third conductive layer, and a fourth conductive layer, which are sequentially arranged away from the base substrate. The semiconductor layer includes active layers of a plurality of transistors in the first pixel driving circuit and the second pixel driving circuit. The first conductive layer may include a scanning signal line and gate electrodes of the plurality of transistors, the second conductive layer may include a first initial signal line, the third conductive layer may include a first power supply line, a data connection electrode, a first connection electrode, and a second connection electrode, and the fourth conductive layer may include a data signal line and a second initial signal line.

In some examples, the driving circuit layer may include a first insulating layer arranged between the base substrate and the semiconductor layer, a second insulating layer arranged between the semiconductor layer and the first conductive layer, a third insulating layer arranged between the first conductive layer and the second conductive layer, a fourth insulating layer arranged between the second conductive layer and the third conductive layer, and a fifth insulating layer arranged between the third conductive layer and the fourth conductive layer.

In order to better understand the structure of the display substrate in the embodiment of the present disclosure, a process of manufacturing the driving circuit layer is the dummy pixel region 02 is described below.

Figure 17:
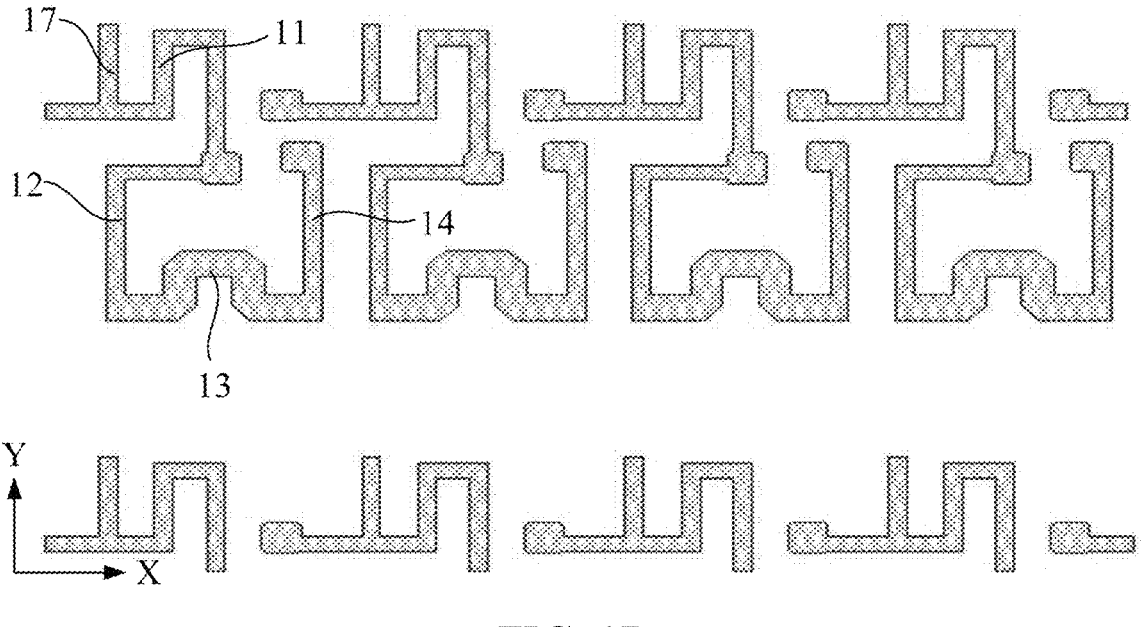
FIG. 17 is a schematic plan view of a semiconductor layer in another display substrate according to the present disclosure.

(1) Forming a pattern of a semiconductor layer. In some examples, the forming a pattern of a semiconductor layer may include: sequentially depositing a first insulating film and a semiconductor film on a base substrate, and patterning the semiconductor film through a patterning process, to form a first insulating layer covering the base substrate and a semiconductor layer arranged on the first insulating layer, as shown in FIG. 17.

In some examples, the semiconductor layer of each circuit unit may include the first active layer 11 of the first transistor T1, the second active layer 12 of the second transistor, the third active layer 13 of the third transistor, the fourth active layer 14 of the fourth transistor, and the seventh active layer 17 of the seventh transistor, which are of an inter-connected one-piece structure.

In some examples, the first active layer 11, the second active layer 12, the fourth active layer 14, and the seventh active layer 17 in the $M^{th}$ row of circuit units are located on a side of the third active layer 13 of the present circuit unit away from the $(M+1)^{th}$ row of circuit units; and the first active layer 11 and the seventh active layer 17 are located on a side of the second active layer 12 and the fourth active layer 14 away from the third active layer 13.

In some examples, the first active layer 11 may have an "n" shape, the second active layer 12 may have a "7" shape, the third active layer 13 may have a "Q" shape, and the fourth active layer 14 may have a "1" shape.

In some examples, the active layer of each transistor may include a first region, a second region, and a channel region between the first region and the second region. In an exemplary embodiment, the first region 11-1 of the first active layer 11 also serves as the first region 17-1 of the seventh active layer 17, the second region 11-2 of the first active layer 11 also serves as the first region 12-1 of the second active layer 12, the first region 13-1 of the third active layer 13 also serves as the second region 14-2 of the fourth active layer 14, and the second region 13-2 of the third active layer 13 also serves as the second region 12-2 of the second active layer 12.

Figure 18:
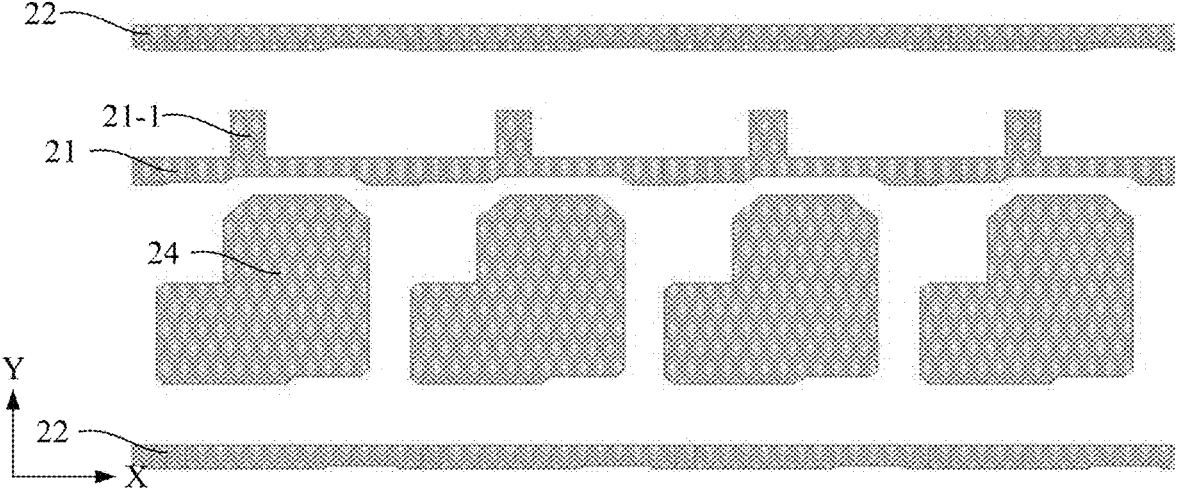
FIG. 18 is a schematic plan view of a first conductive layer in another display substrate according to the present disclosure.

(2) Forming a pattern of a first conductive layer. In some examples, the forming a pattern of a first conductive layer may include: sequentially depositing a second insulating film and a first conductive film on the base substrate with the above described pattern formed thereon, and patterning the first conductive film through a patterning process, to form a second insulating layer covering the pattern of the semiconductor layer and the pattern of the first conductive layer arranged on the second insulating layer. The pattern of the first conductive layer includes, as shown in FIG. 18, at least the first scanning signal line 21, the second scanning signal line 22, and a first plate 24. In some examples, the first conductive layer may be referred to as a first gate metal (GATE1) layer.

It can be seen that it is no need to be provide a light emitting control line in the first conductive layer in the redundant region 022, compared with the first conductive layer in the display region 01. Since the fifth active layer and the sixth active layer are not arranged in the semiconductor layer in each circuit unit in the redundant region 022, an area of the first plate in the redundant region 022 is greater than an area of the first plate 24 in the display region 01, and similarly, an area of the subsequently formed second plate is also greater than an area of the second plate in the display region 01, so that it is realized that the capacitance value of the storage capacitor in the second pixel driving circuit in the redundant region 022 is greater than the capacitance value of the storage capacitor in the first pixel driving circuit in the display region 01.

In conjunction with FIGS. 15 to 18, main portions of the first scanning signal line 21 and the second scanning signal line 22 may each extend in the first direction X. The first scanning signal line 21 and the second scanning signal line 22 of a circuit unit in the $M^{th}$ row are located on a side of a first plate 24 of this circuit unit away from a circuit unit in the $(M+1)^{th}$ row, the second scanning signal line 22 is located on a side of the first scanning signal line 21 of this circuit unit away from the first plate 24.

In some examples, the first plate 24 may have a rectangular shape, corners of the rectangular shape may be chamfered, and an overlapping region exists between an orthographic projection of the first plate 24 on the base substrate and an orthographic projection of the third active layer of the third transistor T3 on the base substrate. In an exemplary embodiment, the first plate 24 may serve as both one plate of the storage capacitor and the gate electrode of the third transistor T3.

In some examples, a region of the first scanning signal line 21 overlapping the second active layer 12 serves as a gate electrode of the second transistor T2. The first scanning signal line 21 is provided with a gate block 21-1 protruding toward the second scanning signal line 22, and an overlapping region exists between an orthographic projection of the gate block 21-1 on the base substrate and an orthographic projection of the second active layer 12 on the base substrate, thereby forming a dual-gate structure of the second transistor T2. A region of the first scanning signal line 21 overlapping the fourth active layer 14 serves as a gate electrode of the fourth transistor T4. A region of the second scanning signal line 22 overlapping the first active layer 11 serves as a gate electrode of the first transistor T1 with a dual-gate structure. A region of the second scanning signal line 22 overlapping the seventh active layer 17 serves as a gate electrode of the seventh transistor T7.

In some examples, after the pattern of the first conductive layer is formed, a part of the semiconductor layer is treated to become a conductor with the first conductive layer as a mask. Channel regions of the first to seventh transistors T1 to T7 are formed by regions of the semiconductor layer masked by the first conductive layer, respectively, and regions of the semiconductor layer not masked by the first conductive layer each become a conductor. That is, both a first region and a second region of each of the first to seventh active layers each become a conductor.

Figure 19:
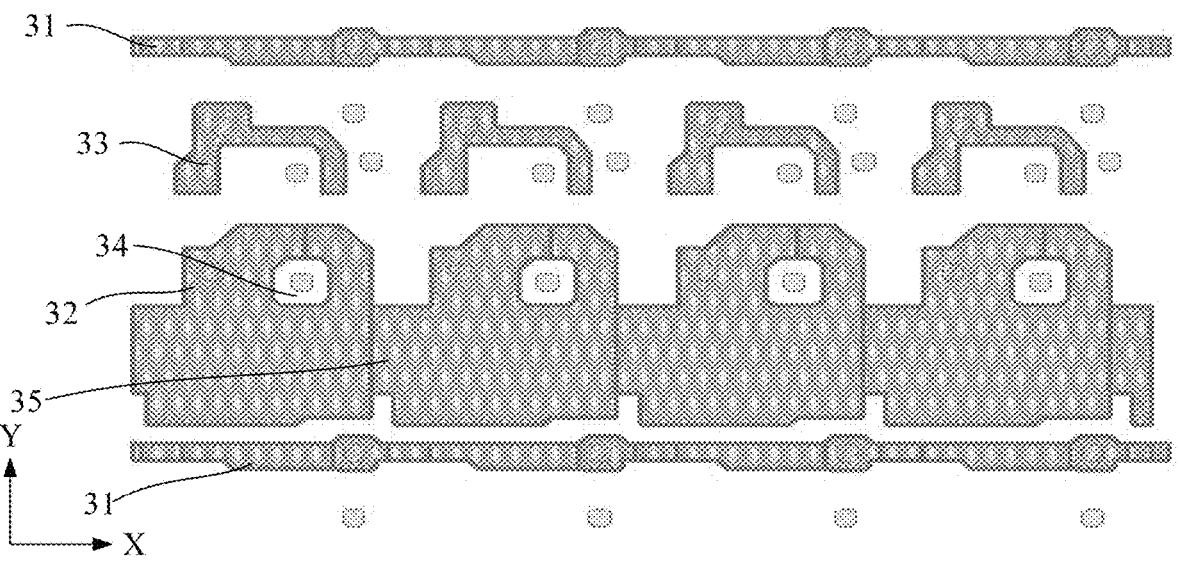
FIG. 19 is a schematic plan view of a second conductive layer in another display substrate according to the present disclosure.

(3) Forming a pattern of a second conductive layer. In some examples, the forming a pattern of the second conductive layer may include: sequentially depositing a third insulating film and a second conductive film on the base substrate with the above described patterns formed thereon, and patterning the second conductive film through a patterning process, to form a third insulating layer covering the first conductive layer and the pattern of the second conductive layer arranged on the third insulating layer. The pattern of the second conductive layer includes, as shown in FIGS. 19, at least the first initial signal line 31, the second plate 32, the shielding electrode 33, and the plate connection line 35. In an examplary embodiment, the second conductive layer may be referred to as a second gate metal (GATE2) layer.

In conjunction with FIGS. 15 to 19, a main portion of the first initial signal line 31 may extend in the first direction X. The first initial signal line 31 of a circuit unit in the $M^{th}$ row is located on a side of the second scanning signal line 22 of this circuit unit away from a circuit units in the $(M+1)^{th}$ row. The second plate 32, as the other plate of the storage capacitor, is located between the first scanning signal line 21 and the first scanning line 21 in the $(M+1)^{th}$ row of this circuit unit. The shielding electrode 33 is located between the second scanning signal line 22 and the first scanning signal line 21 (not including the main portion of the gate block 21-1) of this circuit unit. The shielding electrode 33 is configured to shield a key node from being affected by a data voltage jump, so as to avoid an influence of the data voltage jump on a potential of the key node of the pixel driving circuit, and improve the display effect.

In some examples, the second plate 32 may have a rectangular shape, corners of the rectangular shape may be chamfered. An overlapping region exists between an orthographic projection of the second plate 32 on the base substrate and an orthographic projection of the first plate 24 on the base substrate, and the first plate 24 and the second plate 32 form the storage capacitor of the pixel driving circuit. The second plate 32 has an opening 34, and the opening 34 may be located in the middle of the second plate 32. The opening 34 may be rectangular such that the second plate 32 forms a ring-shaped structure. The opening 34 exposes the third insulating layer covering the first plate 24, and the orthographic projection of the first plate 24 on the base substrate includes the orthographic projection of the opening 34 on the base substrate. In an exemplary embodiment, the opening 34 is configured to receive a subsequently formed first via, which is located within the opening 34 and exposes the first plate 24, to connect a subsequently formed second electrode of the first transistor T1 to the first plate 24.

In an exemplary embodiment, the plate connection line 35 is arranged between the second plates 32 of adjacent circuit units in the first direction X or in a direction opposite to the first direction X. A first end of the plate connection line 35 is connected to the second plate 32 of the circuit unit, and a second end of the plate connection line 35 extends in the first direction X or in the direction opposite to the first direction X and is connected to the second plate 32 of the adjacent circuit unit. That is, the plate connection line 35 is configured to connect the second plates of the adjacent circuit units in a unit row to each other. In an exemplary embodiment, the second plates of the plurality of circuit units in a unit row may form a inter-connected one-piece structure through the plate connection line 35, and the second plates of the one-piece structure may also serve as a power signal line, so as to ensure that the plurality of second plates in a unit row have a same potential, which is beneficial to improving the uniformity of the display panel, avoiding the display defects of the display substrate from occurring, and ensuring a good display effect of the display substrate.

Figure 20:
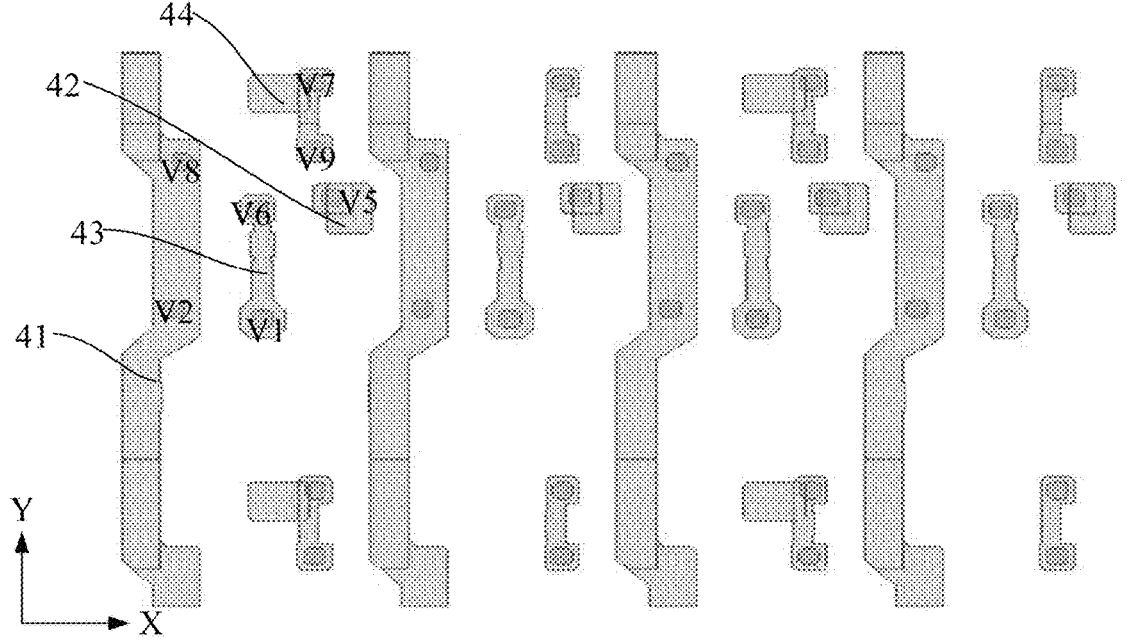
FIG. 20 is a schematic plan view of a third conductive layer in another display substrate according to the present disclosure.

(4) Forming a pattern of a fourth insulation layer. In an exemplary embodiment, the forming a pattern of a fourth insulation layer may include: depositing a fourth insulating film on the base substrate with the above described patterns formed thereon, and patterning the fourth insulating film through a patterning process, to form the fourth insulating layer covering the second conductive layer. Each circuit unit is provided with a plurality of vias, and the plurality of vias include, as shown in FIG. 20, at least a first via V1, a second via V2, a fifth via V5, a sixth via V6, a seventh via V7, an eighth via V8, and a ninth via V9.

In conjunction with FIGS. 15 to 20, the first via V1 is located in the opening 34 of the second plate 32, and an orthographic projection of the first via V1 on the base substrate is within the orthographic projection of the opening 34 on the base substrate.

Parts of the fourth insulating layer and the third insulating layer in the first via V1 are etched away, exposing a surface of the first plate 24.

In some examples, an orthographic projection of the second via V2 on the base substrate is within the orthographic projection of the second plate 32 on the base substrate. A part of the fourth insulating layer in the second via V2 is etched away, exposing a surface of the second plate 32. The second via V2 is configured to connect a subsequently formed first power supply line to the second plate 32 through this via. In some examples, a plurality of second vias V2 as power vias may be provided, and the plurality of second vias V2 may be sequentially arranged along a second direction Y, to increase the connection reliability between the first power supply line and the second plate 32.

In some examples, an orthographic projection of the fifth via V5 on the base substrate is within an orthographic projection of the fourth active layer on the base substrate, and parts of the fourth insulating layer, the third insulating layer and the second insulating layer in the fifth via V5 are etched away, exposing a surface of a first region of the fourth active layer. The fifth via V5 is configured to connect a subsequently formed data signal line to the fourth active layer through this via, and the fifth via V5 is referred to as a data writing hole.

In some examples, an orthographic projection of the sixth via V6 on the base substrate is within an orthographic projection of the second active layer on the base substrate, and parts of the fourth insulating layer, the third insulating layer and the second insulating layer in the sixth via V6 are etched away, exposing a surface of a first region of the second active layer (also a second region of the first active layer). The sixth via V6 is configured to connect the subsequently formed second electrode of the first transistor T1 to the first active layer through this via, and to connect the subsequently formed first electrode of the second transistor T2 to the second active layer through this via.

In some examples, an orthographic projection of the seventh via V7 on the base substrate is within an orthographic projection of the seventh active layer on the base substrate, and parts of the fourth insulating layer, the third insulating layer and the second insulating layer in the seventh via V7 are etched away, exposing a surface of a first region of the seventh active layer (also a first region of the first active layer). The seventh via V7 is configured to connect a subsequently formed first electrode of the seventh transistor T7 to the seventh active layer through this via, and to connect the subsequently formed first electrode of the first transistor T1 to the first active layer through this via.

In some examples, an orthographic projection of the eighth via V8 on the base substrate is within an orthographic projection of the shielding electrode 33 on the base substrate, and a part of the fourth insulating layer in the eighth via V8 is etched away, exposing a surface of the shielding electrode 33. The eighth via V8 is configured to connect the subsequently formed first power supply line with the shielding electrode 33 through this via.

In some examples, an orthographic projection of the eighth via V8 on the base substrate is within an orthographic projection of the shielding electrode 33 on the base substrate, and a part of the fourth insulating layer in the eighth via V8 is etched away, exposing a surface of the shielding electrode 33. The eighth via V8 is configured to connect the subsequently formed first power supply line with the shielding electrode 33 through this via.

(5) forming a pattern of a third conductive layer. In some examples, the forming a pattern of a third conductive layer may include: depositing a third conductive film on the base substrate with the above described patterns formed thereon, and patterning the third conductive film through a patterning process, to form a third conductive layer arranged on the fourth insulating layer. The third conductive layer includes, as shown in FIG. 20, at least a first power supply line 41, a data connection electrode 42, a first connection electrode 43, a second connection electrode 44, and a third connection electrode 45. In some examples, the third conductive layer may be referred to as a first source/drain metal (SD1) layer.

In conjunction with FIGS. 15 to 20, a main portion of the first power supply line 41 extends in the second direction Y. The first power supply line 41 is connected to the second plate 32 through the second via V2 on the one hand, and is connected to the fifth active layer through the third via V3 on the other hand, and further is connected to the shielding electrode 33 through the eighth via V8, so that the shielding electrode 33 and the second plate 32 have the same potential as the first power supply line 41. Since the shielding electrode 33 is connected to the first power supply line 41, and an orthographic projection of at least a part (e.g. a protrusion at the right side of the shielding electrode 33) of the shielding electrode 33 on the base substrate is located between an orthographic projection of the first connection electrode 43 (serving as the second electrode of the first transistor T1 and the first electrode of the second transistor T2, i.e. the second node N2) on the base substrate and an orthographic projection of a subsequently formed data signal line on the base substrate, the influence of the data voltage jump on the key node in the pixel driving circuit may be effectively shielded, the influence of the data voltage jump on the potential of the key node of the pixel driving circuit is avoided, and the display effect is improved.

In some examples, an orthographic projection of the at least a part of the shielding electrode 33 on the base substrate may at least partially overlap an orthographic projection of the subsequently formed data signal line on the base substrate. In an exemplary embodiment, the shielding electrodes 33 in the circuit units adjacent to each other in the first direction X may be connected to each other to reduce resistance.

In some examples, the data connection electrode 42 is connected to the first region of the fourth active layer through the fifth via V5, and the data connection electrode 42 is configured to be connected to the subsequently formed data signal line.

In some examples, the first connection electrode 43 extends in the second direction Y, a first end of the first connection electrode 43 is connected to the second region of the first active layer (also the first region of the second active layer) through the sixth via V6, and a second end of the first connection electrode 43 is connected to the first plate 24 through the first via V1, so that the first plate 24, the second electrode of the first transistor T1, and the first electrode of the second transistor T2 have the same potential. In an exemplary embodiment, the first connection electrode 43 may serve as the second electrode of the first transistor T1 and the first electrode of the second transistor T2.

In some examples, a first end of the second connection electrode 44 is connected to the first initial signal line 31 through the ninth via V9, and a second end of the second connection electrode 44 is connected to the first region of the seventh active layer (also the first region of the first active layer) through the seventh via V7, so that the first electrodes of the seventh transistor T7 and the first electrode of the first transistor T1 have the same potential as the first initial signal line 31. In an exemplary embodiment, the second connection electrode 44 may serve as a first electrode of the seventh transistor T7 and a first electrode of the first transistor T1, and the second connection electrode is configured to be connected to a subsequently formed second initial signal line. In the present disclosure, by arranging the second connection electrode in concurrent connection with the seventh active layer, the first initial signal line and the second initial signal line, the number of vias and the number of transition electrodes can be reduced, and the wiring space can be saved.

In some examples, the first power supply line 41 in at least one circuit unit may be a polygonal line of unequal width. Along the second direction Y, the first power supply line 41 in each circuit unit may include a first power supply section d1, a second power supply section d2, a third power supply section d3, a fourth power supply section d4 and a fifth power supply section d5 which are sequentially connected together. The first power supply section d1, the third power supply section d3 and the fifth power supply section d5 may be parallel to the second direction Y, the second power supply section d2 may be bent toward the first direction X, and the fourth power supply section d4 may be bent toward a direction opposite to the first direction X. An included angle between the second power supply section d2 and the first power supply section d1 may be greater than 0° and less than 90°, and an included angle between the fourth power supply section d4 and the third power supply section d3 may be greater than 0° and less than 90°. The fifth power supply section d5 is provided with a connection part d6 extending in the direction opposite to the first direction X, and the connection part d6 is configured to be connected to the fifth active layer through a third via. The first power supply line 41 adopts an arrangement of a polygonal line, which not only facilitates the layout of the pixel structure, but also reduces a parasitic capacitance between the first power supply line and the data signal line.

In some examples, the shapes of the first power supply lines of the respective circuit units may be the same, or may be different. In an exemplary embodiment, a shape of the first power supply line in the circuit unit in M$^{th}$ row and N$^{th}$ column and a shape of the first power supply line in the circuit unit in (M+1)$^{th}$ row and (N+2)$^{th}$ column may be the same; a shape of the first power supply line in the circuit unit in (M+1)$^{th}$ row and N$^{th}$ column and a shape of the first power supply line in the circuit unit in M$^{th}$ row and (N+2)$^{th}$ column may be the same; a shape of the first power supply line in the circuit unit in M$^{th}$ row and (N+1)$^{th}$ column and a shape of the first power supply line in the circuit unit in (M+1)$^{th}$ row and (N+3)$^{th}$ column may be the same; and a shape of the first power supply line in the circuit unit in (M+1)$^{th}$ row and (N+1)$^{th}$ column and a shape of the first power supply line in the circuit unit in M$^{th}$ row and (N+3)$^{th}$ column may be the same.

In some examples, a shape of the second connection electrode in each circuit unit in the N$^{th}$ column and a shape of the second connection electrode in each circuit unit of the (N+2)$^{th}$ column may be the same, and a shape of the second connection electrode in each circuit unit in the (N+1)$^{th}$ column and a shape of the second connection electrode in each circuit unit in the (N+3)$^{th}$ column may be the same. The second connection electrodes in the circuit units in (N+1)$^{th}$ and (N+3)$^{th}$ columns may have a strip shape extending along the second direction Y, and each of the second connection electrode is configured to be connected to the first initial signal line and the first region of the seventh active layer through a ninth via and a seventh via, respectively. The shape of each of the second connection electrodes 44 in the circuit units in N$^{th}$ and (N+2)$^{th}$ columns may include a first part 44-1 and a second part 44-2 connected to each other. The first part 44-1 has a strip shape extending along the second direction Y, the second part 44-2 has a rectangular shape, and the second part 44-2 is arranged on a side of the first part 44-1 opposite to the first direction X. The first part 44-1 is configured to be connected to the first initial signal line and the first region of the seventh active layer through a ninth via and a seventh via, respectively. The second part 44-2 is configured to be connected to the subsequently formed second initial signal line through a subsequently formed via, thereby realizing connection between the first initial signal line and the second initial signal line.

In some examples, the shapes of the third connection electrodes in the respective circuit units may be the same, or may be different. In an exemplary embodiment, a shape of the third connection electrode in the circuit unit in M$^{th}$ row and N$^{th}$ column and a shape of the third connection electrode in the circuit unit in (M+1)$^{th}$ row and (N+2)$^{th}$ column may be the same; a shape of the third connection electrode in the circuit unit in (M+1)$^{th}$ row and N$^{th}$ column and a shape of the third connection electrode in the circuit unit in M$^{th}$ row and $(N+2)^{th}$ column may be the same; a shape of the third connection electrode in the circuit unit in $M^{th}$ row and $(N+1)^{th}$ column and a shape of the third connection electrode in the circuit unit in $(M+1)^{th}$ row and $(N+3)^{th}$ column may be the same; and a shape of the third connection electrode in the circuit unit in $(M+1)^{th}$ row and $(N+1)^{th}$ column and a shape of the third connection electrode in the circuit unit in $M^{th}$ row and $(N+3)^{th}$ column may be the same.

In an exemplary embodiment, the shapes of the data connection electrode and the first connection electrode in the respective circuit units may be the same, or may be different.

Figure 21:
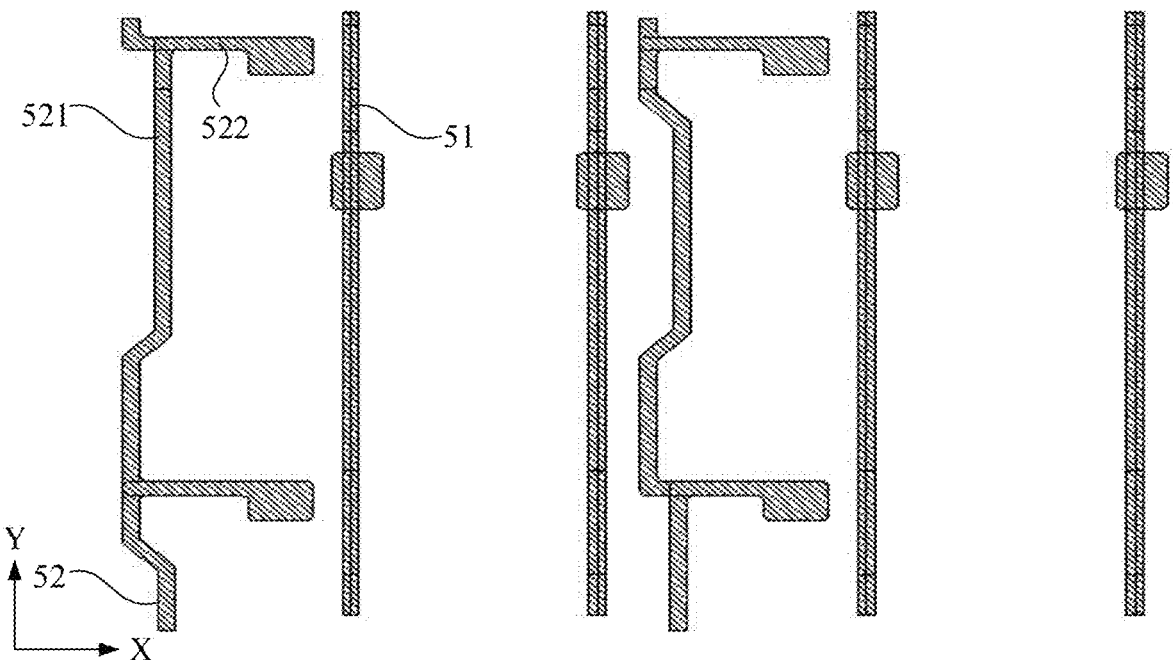
FIG. 21 is a schematic plan view of a fourth conductive layer in another display substrate according to the present disclosure.
Figure 22:
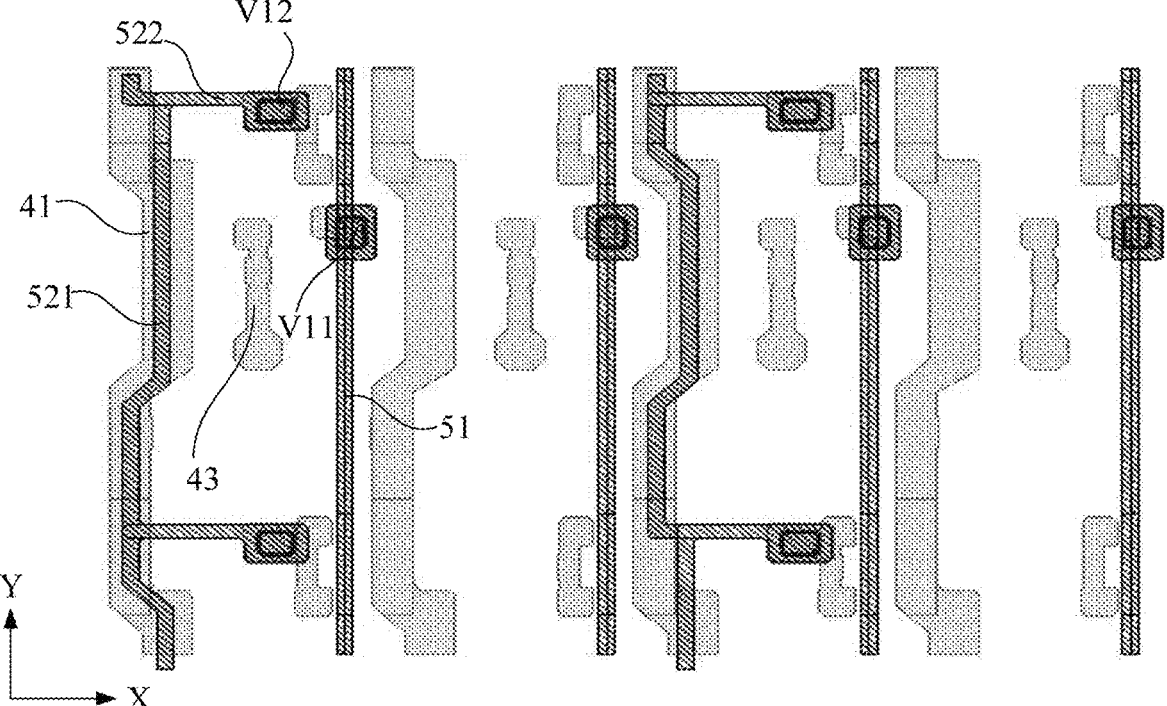
FIG. 22 is a schematic diagram of a third conductive layer and a fourth conductive layer stacked together in another display substrate according to the present disclosure.

(6) Forming a pattern of a first planarization layer. In an exemplary embodiment, the forming a pattern of a first planarization layer may include: coating a first planarization film on the base substrate with the above described patterns formed thereon, and patterning the first planarization film by a patterning process, to form the first planarization layer covering the third conductive layer. As shown in FIGS. 21 and 22, an eleventh via V11 and a twelfth via V12 are arranged in the first planarization layer.

In conjunction with FIGS. 21 and 22, an orthographic projection of the eleventh via V11 on the base substrate is within an orthographic projection of the data connection electrode 42 on the base substrate, and a part of the first planarization layer in the eleventh via V11 is removed, exposing a surface of the data connection electrode 42. The eleventh via V11 is configured to connect a subsequently formed data signal line to the data connection electrode 42 through this via.

In some examples, the eleventh via V11 may be in a strip shape, and an extension length of the eleventh via V11 in the second direction Y is greater than an extension length thereof in the first direction X.

An orthographic projection of the twelfth via V12 on the base substrate is within an orthographic projection of the second connection electrode 44 on the base substrate, and a part of the first planarization layer in the twelfth via V12 is removed, exposing a surface of the second connection electrode 44. The twelfth via V12 is configured to connect the subsequently formed second initial signal line to the second connection electrode 44 through this via.

In some examples, all the circuit units are provided with the eleventh via V11, each of the circuit units in the $N^{th}$ and $(N+2)^{th}$ columns is provided with the twelfth via V12, and each of the circuit units in the $(N+1)^{th}$ and $(N+3)^{th}$ columns is not provided with the twelfth via V12.

In an exemplary embodiment, the positions of the eleventh via V11 and the thirteenth via V13 in the respective circuit units may be the same, or may be different.

(7) Forming a pattern of a fourth conductive layer. In an exemplary embodiment, the forming a pattern of a fourth conductive layer may include: depositing a fourth conductive film on the base substrate with the above described patterns formed thereon, and patterning the fourth conductive film through a patterning process, to form the fourth conductive layer arranged on the first planarization layer. The fourth conductive layer includes, as shown in FIGS. 21 and 22, at least a data signal line 51, and a second initial signal line 52.

In conjunction with FIGS. 15 to 22, the data signal line 51 is provided in each unit column. The data signal line 51 may extend in the second direction Y, and the data signal line 51 is connected to the data connection electrode 42 through the eleventh via V11. Since the data connection electrode 42 is connected to the first region of the fourth active layer through the fifth via V5, it is achieved that the data signal line 51 is connected to the first region of the fourth active layer through the data connection electrode 42, to write the data signal into the fourth transistor T4.

In an exemplary embodiment, the second initial signal lines 52 are arranged in the Nth unit column and the (N+2)th unit column, and the second initial signal lines 52 in all the circuit units in the unit column are connected to each other. A main portion of the second initial signal line 52 extends in the second direction Y, and the second initial signal line 52 is connected to the second connection electrode 44 through the twelfth via V12. Since the second connection electrode 44 is connected to the first initial signal line 31 through the ninth via V9, it is realized that the second initial signal line 52 is connected to the first initial signal line 31 through the second connection electrode 44, so that the first initial signal line 31 and the second initial signal line 52 have the same potential. In the present disclosure, by arranging the first initial signal line 31 with the main portion extending along first direction X and the second initial signal line 52 with the main portion extending along second direction Y, the initial signal lines form a network structure, which not only effectively reduces a resistance of the initial signal lines and a drop of the initial voltage, but also effectively improves uniformity of the initial voltage in the display substrate, the display uniformity, thereby the display performance and the display quality.

In some examples, the second initial signal line 52 in one circuit unit may include an extension part 521 and a connection part 522. The extension part 521 may be a polygonal line, which has a main portion extending along the second direction Y, and the connection part 522 may be a straight line, which has a main portion extending along the first direction X. In an exemplary embodiment, an end of the connection part 522 away from the extension part 521 may be connected to the second connection electrode 44 through the twelfth via V12.

In some examples, an orthographic projection of at least a part of the extension part 521 on the base substrate is within an orthographic projection of the first power supply line 41 on the base substrate, so that the first power supply line 41 can effectively shield the influence of the second initial signal line 52 on the key node in the pixel driving circuit, the potential at the key node of the pixel driving circuit can be prevented from being affected by the initial signal, the layout space can be fully utilized, the light transmittance can be prevented from being affected by the arrangement of the second initial signal line, and the display effect is improved.

In some examples, an orthographic projection of at least a part of the connection part 522 on the base substrate is within an orthographic projection of the first initial signal line 31 on the base substrate, so that the layout space can be fully utilized, the light transmittance is prevented from being affected by the arrangement of the second initial signal line, and the display effect is improved.

In some examples, in the circuit unit having the first pixel driving circuit, an overlapping region between orthographic projections of the second plate 32 of the storage capacitor and the extension part 521 on the base substrate is a first region; in the circuit unit having the second pixel driving circuit, an overlapping region between orthographic projections of the second plate 32 of the storage capacitor and the extension part 521 on the base substrate is a second region; and an area of the first region is less than an area of the second region.

In some examples, the display substrate includes i number of rows and j number of columns of circuit units, where i≥2, and j≥3; a shape of the second initial signal line 52 in the circuit unit in $M^{th}$ row and $N^{th}$ column and a shape of the second initial signal line 52 in the circuit unit in $(M+1)^{th}$ row and $(N+2)^{th}$ column may be the same; and a shape of the second initial signal line 52 in the circuit unit in $(M+1)^{th}$ row and $N^{th}$ column and a shape of the second initial signal line 52 in the circuit unit in $M^{th}$ row and $(N+2)^{th}$ column may be the same, where $1\leq M\leq I$, $1\leq N\leq j$, and both of M and N are integers.

In some examples, in the circuit unit in $M^{th}$ row and $N^{th}$ column and the circuit unit in $(M+1)^{th}$ row and $(N+2)^{th}$ column, the extension part 521 may include a first initial section c1, a second initial section c2, and a third initial section c3, which are sequentially connected together along the second direction Y. The first initial section c1 and the third initial section c3 may be parallel to the second direction Y, the second initial section c2 may be deflected toward a direction opposite to the first direction X, a first included angle θ1 exists between the second initial section c2 and the second direction Y, and the first included angle θ1 may be greater than 0° and less than 90°.

In some examples, in the circuit unit in $M^{th}$ row and $(N+2)^{th}$ column and the circuit unit in $(M+1)^{th}$ row and $N^{th}$ column, the extension part 521 may include a fourth initial section c4, a fifth initial section c5, a sixth initial section c6, a seventh initial section c7, and an eighth initial section c8 sequentially connected together along the second direction Y. The fourth initial section c4, the sixth initial section c6, and the eighth initial section c8 may be parallel to the second direction Y, a first included angle 01 may exist between the fifth initial section c5 and the second direction Y, a second included angle θ2 may exist between the seventh initial section c7 and the second direction Y, the first included angle θ1 may be greater than 0° and less than 90°, and the second included angle θ2 may be greater than 0° and less than 90°.

In some examples, the extending direction of the fifth initial section c5 and the extending direction of the seventh initial section c7 may be substantially mirror-symmetrical to each other with respect to the first direction X.

In some examples, at least a part of the circuit units are provided with the data signal line 51, each of the circuit units in the $N^{th}$ column and the $(N+2)^{th}$ column is provided with the second initial signal line 52, and each of the circuit units in the $(N+1)^{th}$ column and the $(N+3)^{th}$ column is not provided with the second initial signal line 52.

Till here, the manufacturing of the driving circuit layer is completed.

In the embodiment of the present disclosure, not only the initial signal lines include the first initial signal line extending in the first direction and the second initial signal line extending in the second direction, but also than the capacitance value of the storage capacitor in the second pixel driving circuit located in the redundant region 022 is greater than the capacitance value of the storage capacitor in the first pixel driving circuit located in the display region 01, and thus the problem of display uniformity caused by the presence of the dummy pixel region 02 can be alleviated.

In addition, in the embodiment of the present disclosure, the materials of the layers in the dummy pixel region 02 are the same as those of the layers in the display region 01 in the above examples, therefore the description thereof is not repeated herein.

In any of the above examples, the second initial signal lines of the initial signal lines are arranged in the fourth conductive layer. In some examples, the second initial signal lines may alternatively be arranged in the third conductive layer, as long as it is ensured that the first initial signal lines and the second initial signal lines arranged crosswise can be electrically connected together. Such an arrangement can also achieve the above-described effects, therefore the description thereof is not be repeated herein.

The present disclosure further provides a including the display substrate described above. The display apparatus may be any product or component having a display function, such as a mobile phone, a tablet computer, a television, a monitor, a notebook computer, a digital photo frame, a navigator, or the like, but the embodiment of the present disclosure is not limited thereto.

It will be understood that the above embodiments are merely exemplary embodiments adopted to illustrate the principles of the present disclosure, and the present disclosure is not limited thereto. It will be apparent to one of ordinary skill in the art that various modifications and improvements can be made without departing from the spirit and scope of the present disclosure, and such modifications and improvements are also considered to be within the scope of the present disclosure.

What is claimed is:

1. A display substrate, having a display region and a dummy pixel region adjacent to the display region, wherein the dummy pixel region comprises at least one pixel missing region and a redundant region adjacent to the at least one pixel missing region; and the display substrate comprises:

a base substrate;

a driving circuit layer on the base substrate, wherein the driving circuit layer comprises a plurality of circuit units; at least one of the plurality of circuit units comprises a plurality of pixel driving circuits and a plurality of initial signal lines; the plurality of pixel driving circuits comprise a first pixel driving circuit in the display region and a second pixel driving circuit in the redundant region, and a capacitance value of a storage capacitor in the first pixel driving circuit is less than a capacitance value of a storage capacitor in the second pixel driving circuit; and a light emitting structure layer on a side of the driving circuit layer away from the base substrate, wherein the light emitting structure layer comprises a plurality of light emitting devices in the display region, wherein the plurality of initial signal lines comprise a plurality of first initial signal lines each extending along a first direction and a plurality of second initial signal lines each extending along a second direction; the first direction and the second direction cross each other, and each of the plurality of first initial signal lines is electrically connected to at least a part of the plurality of second initial signal lines crossing the first initial signal line, wherein the driving circuit layer comprises a semiconductor layer, a first conductive layer, a second conductive layer, a third conductive layer, and a fourth conductive layer in this order away from the base substrate; the semiconductor layer comprises active layers of a plurality of transistors in the pixel driving circuit; the first conductive layer comprises a scanning signal line, gate electrodes of the plurality of transistors and a first plate of the storage capacitor; the second conductive layer comprises the first initial signal line and a second plate of the storage capacitor; and the fourth conductive layer comprises the second initial signal line, wherein the second initial signal line comprises an extension part and a connection part connected to each other; the extension part extends in the second direction, and the connection part is connected to the first initial signal line, wherein in the circuit unit having the first pixel driving circuit, an overlapping region between orthographic projections of the second plate of the storage capacitor and the extension part on the base substrate is a first region; in the circuit unit having the second pixel driving circuit, an overlapping region between orthographic projections of the second plate of the storage capacitor and the extension part on the base substrate is a second region; and an area of the first region is less than an area of the second region.

2. The display substrate according to claim 1, wherein the first pixel driving circuit and the second pixel driving circuit each comprise a first transistor, a second transistor, a third transistor, a fourth transistor, a seventh transistor, and the storage capacitor; and the first pixel driving circuit further comprises a fifth transistor and a sixth transistor.

3. The display substrate according to claim 1, wherein the display substrate comprises i number of rows and j number of columns of circuit units; $i \geq 2$; $j \geq 3$; and both of i and j are integers;

wherein a shape of the second initial signal line in the circuit unit in an $M^{th}$ row and an $N^{th}$ column and a shape of the second initial signal line in the circuit unit in an $(M+1)^{th}$ row and an $(N+2)^{th}$ column are substantially the same as each other; a shape of the second initial signal line in the circuit unit in the $(M+1)^{th}$ row and the $N^{th}$ column and a shape of the second initial signal line in the circuit unit in the $M^{th}$ row and the $(N+2)^{th}$ column are substantially the same as each other, wherein $1 \leq M \leq i$; $1 \leq N \leq j$; and both of M and N are integers.

4. The display substrate according to claim 3, wherein in the circuit unit in the $M^{th}$ row and the $N^{th}$ column and the circuit unit in the $(M+1)^{th}$ row and the $(N+2)^{th}$ column, the extension part comprises a first initial section, a second initial section and a third initial section sequentially connected together along the second direction, the first initial section and the third initial section each extend along the second direction, and a first included angle $\theta 1$ exists between an extending direction of the second initial section and the second direction, $0° \leq \theta 1 \leq 90°$.

5. The display substrate according to claim 3, wherein in the circuit unit in the $M^{th}$ row and the $(N+2)^{th}$ column and the circuit unit in the $M^{th}$ row and the $N^{th}$ column, the extension part comprises a fourth initial section, a fifth initial section, a sixth initial section, a seventh initial section and an eighth initial section sequentially connected along the second direction, the fourth initial section, the sixth initial section and the eighth initial section each extend along the second direction, a second included angle $\theta 2$ exists between an extending direction of the fifth initial section and the second direction, a third included angle $\theta 3$ exists between an extending direction of the seventh initial section and the second direction, $0° \leq \theta 2 \leq 90°$, and $0° \leq \theta 3 \leq 90°$.

6. The display substrate according to claim 1, wherein the plurality of circuit units further comprise a plurality of first power supply lines, an orthographic projection of the extension part on the base substrate at least partially overlaps an orthographic projection of a corresponding one of the plurality of first power supply lines on the base substrate; and an orthographic projection of the connection part on the base substrate at least partially overlaps an orthographic projection of the first initial signal line on the base substrate.

7. The display substrate according to claim 6, wherein the first power supply line is a polygonal line of unequal width; the first power supply line comprises a first power supply section, a second power supply section, a third power supply section, a fourth power supply section and a fifth power supply section sequentially connected along the second direction; the first power supply section, the third power supply section, and the fifth power supply section each extend along the second direction, and an extending direction of the second power supply section and an extending direction of the fourth power supply section are different from each other and each cross the second direction.

8. The display substrate according to claim 6, wherein the first power supply line is in the third conductive layer.

9. The display substrate according to claim 6, wherein the second conductive layer further comprises a shielding electrode electrically connected to the first power supply line through a via.

10. The display substrate according to claim 9, wherein an orthographic projection of at least a part of the shielding electrode on the base substrate is between orthographic projections of a data signal line and a second electrode of the first transistor in the pixel driving circuit on the base substrate.

11. The display substrate according to claim 1, wherein the plurality of circuit units further comprise a plurality of data signal lines in the fourth conductive layer.

12. The display substrate according to claim 1, wherein the plurality of circuit units further comprise a plurality of second connection electrodes; the connection part is connected to a corresponding one of the plurality of second connection electrodes through a via; the second connection electrode is connected to the first initial signal line through a via; the second connection electrode is further connected to a first region of a first transistor and a second region of a seventh transistor in the pixel driving circuit through vias.

13. The display substrate according to claim 12, wherein the plurality of second connection electrodes are in the third conductive layer.

14. The display substrate according to claim 1, wherein an overlapping area between a first plate and a second plate of the storage capacitor in the first pixel driving circuit is less than an overlapping area between a first plate and a second plate of the storage capacitor in the second pixel driving circuit.

15. The display substrate according to claim 1, wherein the plurality of circuit units form a plurality of unit rows arranged side by side along the second direction and a plurality of unit columns arranged side by side along the first direction, the pixel driving circuits in each of the plurality of unit rows are arranged side by side along the first direction; the pixel driving circuits in each of the plurality of unit columns are arranged side by side along the second direction; and the second initial signal lines in all the circuit units in each of at least one of the plurality of unit columns are connected to each other.

16. The display substrate according to claim 15, wherein the plurality of unit columns comprise a plurality of first unit columns and a plurality of second unit columns alternately arranged; and each of the plurality of second initial signal lines is arranged in a corresponding one of the plurality of first unit columns.

17. A display apparatus, comprising the display substrate according to claim 1.

* * * * *